United States Patent
Byeon et al.

(10) Patent No.: US 11,901,386 B2
(45) Date of Patent: Feb. 13, 2024

(54) IMAGE SENSOR HAVING A SLOPED LIGHT BLOCKING PATTERN STRUCTURE

(71) Applicant: SAMSUNG ELECTRONICS CO., LTD., Suwon-si (KR)

(72) Inventors: Kyeong Jae Byeon, Hwaseong-si (KR); Byung Jun Park, Yongin-si (KR); Jin Pyo Kim, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 192 days.

(21) Appl. No.: 17/060,051

(22) Filed: Sep. 30, 2020

(65) Prior Publication Data
US 2021/0272999 A1   Sep. 2, 2021

(30) Foreign Application Priority Data

Mar. 2, 2020   (KR) .................. 10-2020-0025731

(51) Int. Cl.
*H01L 27/146*   (2006.01)

(52) U.S. Cl.
CPC .... *H01L 27/14627* (2013.01); *H01L 27/1464* (2013.01); *H01L 27/14603* (2013.01); *H01L 27/14621* (2013.01); *H01L 27/14636* (2013.01); *H01L 27/14685* (2013.01); *H01L 27/1462* (2013.01); *H01L 27/1463* (2013.01)

(58) Field of Classification Search
None
See application file for complete search history.

(56) References Cited

U.S. PATENT DOCUMENTS

| | | | |
|---|---|---|---|
| 7,196,012 B2 | 3/2007 | Hseih et al. | |
| 8,477,223 B2 | 7/2013 | Itonaga | |
| 9,219,092 B2 | 12/2015 | Jangjian et al. | |
| 9,412,774 B2 | 8/2016 | Choi et al. | |
| 9,543,353 B2 | 1/2017 | Cheng et al. | |
| 10,263,024 B2 | 4/2019 | Nakata | |
| 2004/0077121 A1* | 4/2004 | Maeda | H01L 27/14625 257/E27.15 |
| 2009/0124037 A1 | 5/2009 | Yu | |
| 2011/0227180 A1 | 9/2011 | Murakoshi | |
| 2011/0242376 A1* | 10/2011 | Ando | H01L 27/14685 257/E31.127 |

(Continued)

FOREIGN PATENT DOCUMENTS

| | | |
|---|---|---|
| JP | 2019-160847 | 9/2019 |
| KR | 10-2001-0004173 | 1/2001 |

*Primary Examiner* — Jennifer D Bennett
*Assistant Examiner* — Erin R Garber
(74) *Attorney, Agent, or Firm* — F. Chau & Associates, LLC

(57) ABSTRACT

An image sensor includes a first region and a second region surrounding the first region. A substrate includes a first surface and a second surface that is opposite to the first surface. A photoelectric conversion element is disposed on the substrate. A passivation layer is disposed on the first surface of the substrate. A microlens is disposed on the passivation layer in the first region and is not disposed on the passivation layer in the second region. A pattern structure is disposed on an upper surface of the passivation layer in the second region. The pattern structure includes a metal and has at least one lateral side wall having a sloped profile.

15 Claims, 20 Drawing Sheets

(56) References Cited

U.S. PATENT DOCUMENTS

| | | | |
|---|---|---|---|
| 2015/0221695 A1* | 8/2015 | Park | H01L 23/481 |
| | | | 257/774 |
| 2019/0157324 A1 | 5/2019 | Watanabe et al. | |
| 2020/0119099 A1* | 4/2020 | Shibuta | H01L 27/14623 |
| 2020/0359915 A1* | 11/2020 | Kobayashi | A61B 5/026 |
| 2021/0005655 A1* | 1/2021 | Kawazoe | H04N 5/335 |
| 2022/0139978 A1* | 5/2022 | Kamei | H01L 27/14647 |
| | | | 257/432 |

* cited by examiner

10

IMAGE SENSOR HAVING A SLOPED LIGHT BLOCKING PATTERN STRUCTURE

This application claims priority under 35 U.S.C. § 119 to Korean Patent Application No. 10-2020-0025731 filed on Mar. 2, 2020 in the Korean Intellectual Property Office, the disclosure of which is incorporated by reference in its entirety herein.

TECHNICAL FIELD

The present inventive concepts relate to an image sensor.

DISCUSSION OF RELATED ART

An image sensor is an element that converts an optical image into an electric signal. Recently, as the computer industry and communication industry have developed, there has been an increased demand for image sensors having improved performance for application in various electronic devices such as a digital camera, a video camera, a personal communication system (PCS), a game console, a security camera, a medical micro camera, and a robot.

SUMMARY

Aspects of the present inventive concepts provide an image sensor that uniformly forms a thickness dispersion of a configuration formed by a coating process, by forming a spin pattern structure in which a lateral side wall has a sloped profile in at least one of an optical black sensor region, a pad region and a connection region.

According to an exemplary embodiment of the present inventive concepts, an image sensor includes a first region and a second region surrounding the first region. A substrate includes a first surface and a second surface that is opposite to the first surface. A photoelectric conversion element is disposed on the substrate. A passivation layer is disposed on the first surface of the substrate. A microlens is disposed on the passivation layer in the first region and is not disposed on the passivation layer in the second region. A pattern structure is disposed on an upper surface of the passivation layer in the second region. The pattern structure includes a metal and has at least one lateral side wall having a sloped profile.

According to an exemplary embodiment of the present inventive concepts, an image sensor includes a first region and a second region surrounding the first region. A substrate includes a first, surface and a second surface that is opposite to the first surface. A photoelectric conversion element is disposed inside the substrate in each of the first and second regions, microlens is disposed on the first surface of the substrate in the first region. The microlens is not disposed on the first surface of the substrate in the second region. A pattern structure is disposed on the first surface of the substrate in the second region. The pattern structure includes at least one lateral side wall having a sloped profile. The pattern structure includes a first layer and a second layer disposed on the first layer. The first layer and the second layer include different metals from each other.

According to an exemplary embodiment of the present inventive concepts, an image sensor includes a first region and a second region surrounding the first region. A substrate includes a first surface and a second surface that is opposite to the first surface. A photoelectric conversion element is disposed inside the substrate in each of the first and second regions. A passivation layer is disposed on the first surface of the substrate. A microlens is disposed on the first surface of the substrate in the first region. The microlens is not disposed on the first surface of the substrate in the second region. A pattern structure is disposed on the passivation layer in the second region. The pattern structure includes a first layer and a second layer disposed on the first layer. At least one lateral side wall of each of the first layer and the second layer have a sloped profile. The first layer and the second layer include different metals from each other.

However, aspects of the present inventive concepts are not restricted to those set forth herein. The above and other aspects of the present inventive concepts will become more apparent to one of ordinary skill in the art to which the present inventive concepts pertain by referencing the detailed description of the exemplary embodiments given below.

BRIEF DESCRIPTION OF THE DRAWINGS

The above and other aspects and features of the present inventive concepts will become more apparent by describing in detail exemplary embodiments thereof with reference to the attached drawings, in which.

DETAILED DESCRIPTION OF EXEMPLARY EMBODIMENTS

Hereinafter, an image sensor according to exemplary embodiments of the present inventive concepts will be described with reference to FIGS. 1 to 5.

Figure 1:
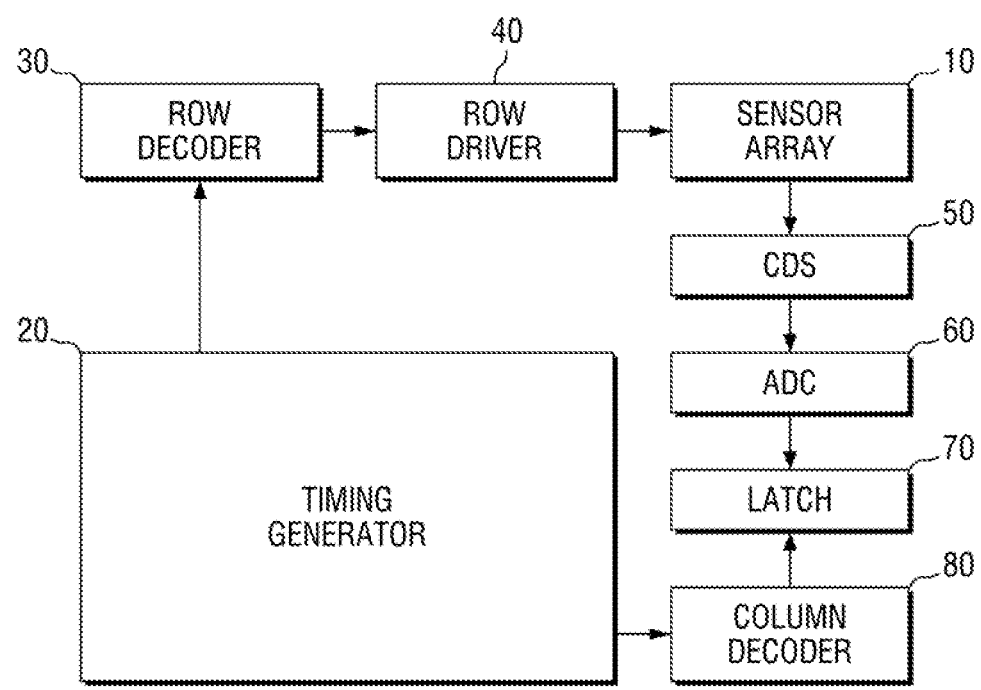
FIG. 1 is a block diagram of an image sensor according to an exemplary embodiment of the present inventive concepts.
Figure 2:
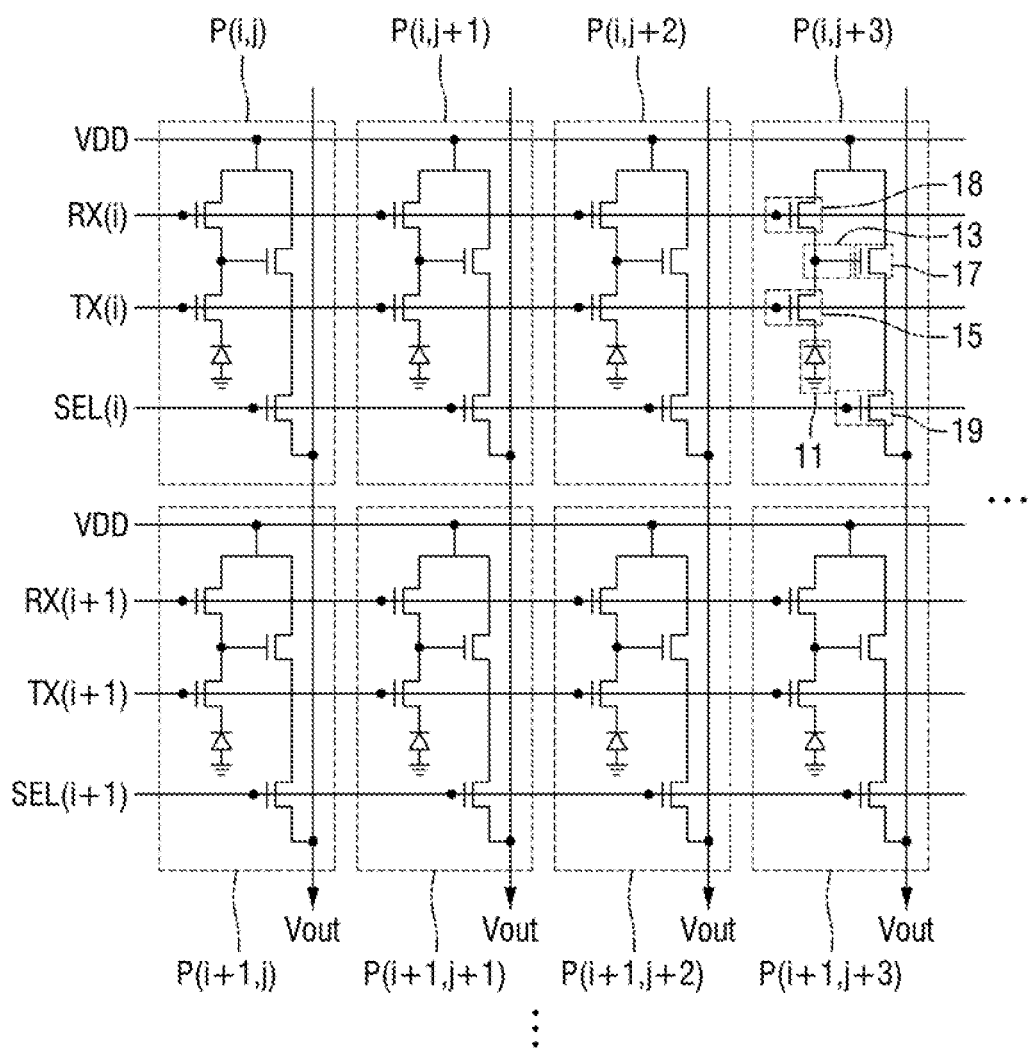
FIG. 2 is an exemplary circuit diagram of a unit pixel region of an image sensor according to an exemplary embodiment of the present inventive concepts.
Figure 3:
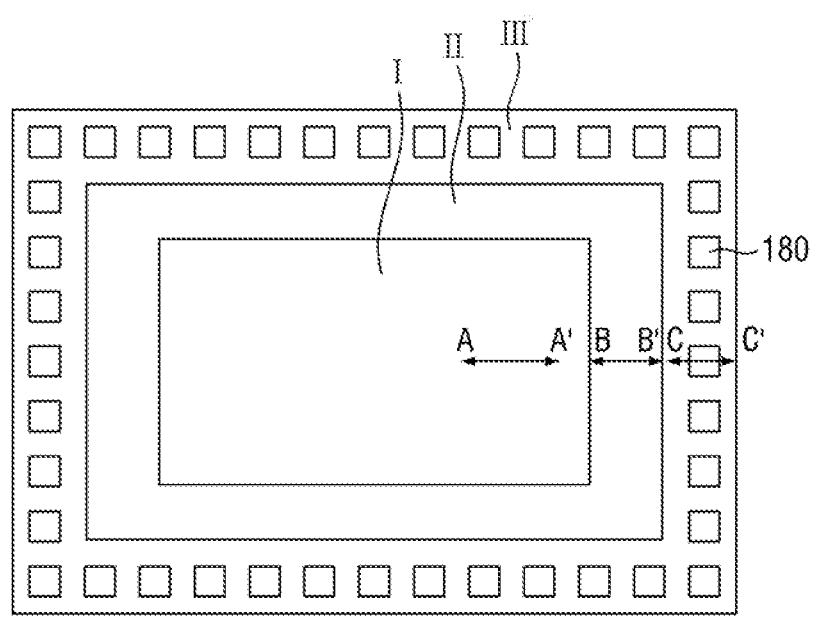
FIG. 3 is a plan view of an image sensor according to an exemplary embodiment of the present inventive concepts.
Figure 3:
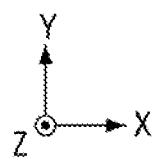
Figure 4:
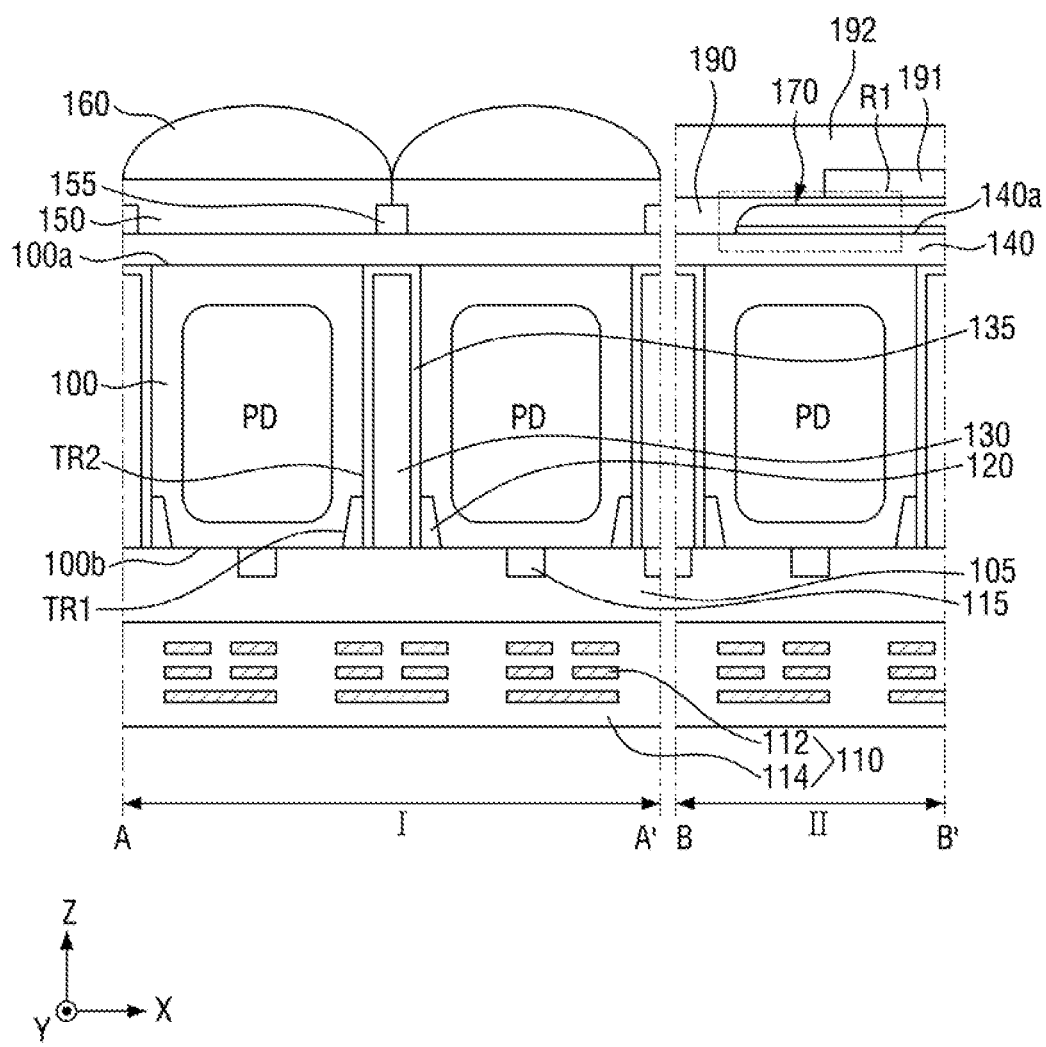
FIG. 4 is a cross-sectional view an image sensor taken along line A-A" and line B-B' of FIG. 3 according to an exemplary embodiment of the present inventive concepts.
Figure 5:
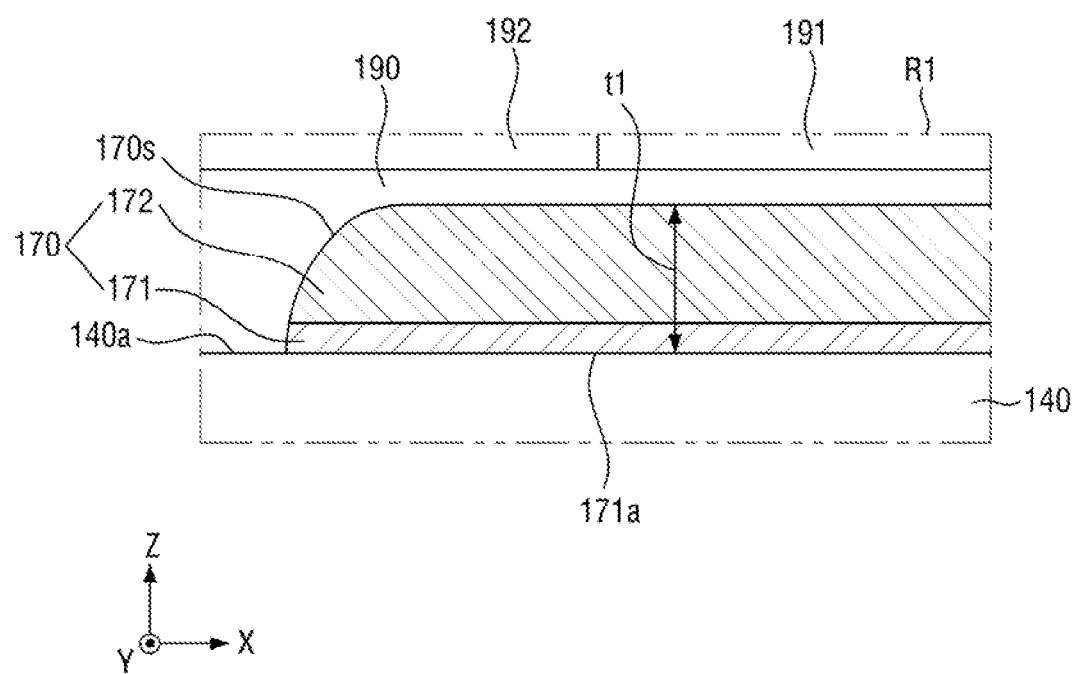
FIG. 5 is an enlarged view of region R1 of FIG. 4 according to an exemplary embodiment of the present inventive concepts.

FIG. 1 is a block diagram of an image sensor according to an exemplary embodiment of the present inventive concepts. FIG. 2 is an exemplary circuit diagram of a unit pixel region of an image sensor according to an exemplary embodiment of the present inventive concepts. FIG. 3 is a schematic plan view of an image sensor according to an exemplary embodiment of the present inventive concepts. FIG. 4 is a cross-sectional view taken along each of line A-A' and line B-B' of FIG. 3 according to an exemplary embodiment of the present inventive concepts. FIG. 5 is an enlarged view in which a region R1 of FIG. 4 is enlarged according to an exemplary embodiment of the present inventive concepts.

Referring to FIG. 1, an image sensor according to an exemplary embodiment of the present inventive concepts includes an active pixel sensor array 10, a timing generator 20, a row decoder 30, a row driver 40, a correlated double sampler (CDS) 50, an analog-to-digital converter (ADC) 60, a latch 70 and a column decoder 80.

The active pixel sensor array 10 includes photoelectric conversion elements and a plurality of unit pixels arranged two-dimensionally. The plurality of unit pixels may convert an optical image into an electrical output signal.

The active pixel sensor array 10 receives a plurality of driving signals such as a row selection signal, a reset signal, and a charge transfer signal from the row driver 40, and may be driven thereby. In an exemplary embodiment, a convened electrical output signal formed by the active pixel sensor array 10 may be provided to the correlated double sampler 50 through a vertical signal line.

The timing generator 20 may provide a timing signal and a control signal to the row decoder 30 and the column decoder 80.

The row driver 40 may provide a plurality of drive signals for driving a plurality of unit pixels to the active pixel sensor array 10 depending on the results decoded by the row decoder 30. In an exemplary embodiment, when the unit pixels are arranged in the form of matrix, a driving signal may be provided for each row.

The correlated double sampler 50 may receive, hold and sample the output signals formed by the active pixel sensor array 10 through the vertical signal lines. For example, in an exemplary embodiment, the correlated double sampler 50 may doubly sample the specific noise level and the signal level due to the output signal, and may output a difference level corresponding to a difference between the noise level and the signal level.

The analog-to-digital converter 60 may convert an analog signal corresponding to the difference level into a digital signal and output the digital signal.

The latch 70 may latch the digital signal, and the latched signal may be sequentially output to the image signal processing unit, depending on the decoding results in the column decoder 80.

Referring to the exemplary embodiment of FIG. 2, pixels P are arranged in the form of matrix to constitute an active pixel sensor array 10. Each pixel P includes a photoelectric conversion element 11, a floating diffusion region 13, a charge transmission element 15, a drive element 17, a reset element 18, and a selection element 19. As shown in the exemplary embodiment of FIG. 2, for these features, i row pixels (P(i, j), P (i, j+1), P(i, j+2), P(i, j+3), . . . ) will be explained as an example. However, exemplary embodiments of the present inventive concepts are not limited thereto.

The photoelectric conversion element 11 may absorb incident light and accumulate charges corresponding to the amount of light in the incident light. In an exemplary embodiment, a photodiode, a phototransistor, a photogate, a pinned photodiode or a combination thereof may be applied as the photoelectric conversion element 11. However, exemplary embodiments of the present inventive concepts are not limited thereto. For convenience of illustration, a photodiode is shown as an example of the photoelectric conversion element 11 in the drawings.

The photoelectric conversion element 11 may be coupled with the charge transmission element 15 that transmits the accumulated charges to the floating diffusion region 13.

The floating diffusion region (FD) 13 is region which converts the charges into voltage and has a parasitic capacitance. Therefore, charges may be accumulatively stored in the floating diffusion region 13.

The drive element 17 exemplified as a source follower amplifier may amplify a change in the electric potential of the floating diffusion region 13 to which the charges accumulated in the photoelectric conversion element 11 are transferred, and may output the change in the electrical potential of the floating diffusion region 13 to an output line Vout.

The reset element 18 may periodically reset the floating diffusion region 13. In an exemplary embodiment, the reset element 18 may include a single MOS transistor driven by a bias provided by a reset line RX(i) that applies a predetermined bias (e.g., a reset signal).

When the reset element 18 is turned on by the bias provided by the reset line RX(i), a predetermined electric potential provided to the drain of the reset element 18, for example, a power supply voltage VDD, may be transferred to the floating diffusion region 13.

The selection element 19 may perform the function of selecting the pixels P to be read row by row. In an exemplary embodiment, the selection element 19 may include a single MOS transistor driven by a bias (e.g., a row selection signal) provided by a row selection line SEL(i).

When the selection element 19 is turned on by the bias provided by the row selection line SEL(i), a predetermined electric potential provided to the drain of the selection element 19, such as the power supply voltage VDD, may be transferred to a drain region of the drive element 17.

A transmission line TX(i) which applies the bias to the charge transmission element 15, a reset line RX(i) which applies the bias to the reset element 18, and a row selection line SEL(i) which applies the bias to the selection element 19 may each extend in a row direction and may be arranged substantially parallel to each other in the row direction.

Referring to the exemplary embodiment of FIG. 3, an image sensor according to an exemplary embodiment of the present inventive concepts may include first to third regions I, II and III.

In an exemplary embodiment, the first region I and the second region II may be sensor array regions. As shown in the exemplary embodiment of FIG. 3, the second region H may surround the first region I in a plane defined by a first direction X (hereinafter, the "X direction") and a second direction Y (hereinafter, the "Y direction") perpendicular to the X direction. The X and Y directions may be substantially parallel to an upper surface of a first substrate 100 (shown in FIG. 4) For example, as shown in the exemplary embodiment of FIG. 3, the second region if may completely surround the first region I in the X and Y directions. However, exemplary embodiments of the present inventive concepts are not limited thereto.

In an exemplary embodiment, the first region I may be an active pixel sensor region including active pixels for generating active signals corresponding to the wavelengths of light from the outside. The second region II may be an optical black sensor region for blocking light from the outside to generate an optical black signal.

As shown in the exemplary embodiment of FIG. 3, the third region III may be a pad region which includes a plurality of pads 180. The plurality of pads 180 disposed in the third region III may send and receive electrical signals to and from an external device. As shown in the exemplary embodiment of FIG. 3, the third region III may surround the second region H in the X and Y directions. For example, the third region III may completely surround the second region II in the plane defined by the X direction and the Y direction. However, exemplary embodiments of the present inventive concepts are not limited thereto.

Referring to FIGS. 3 to 5, an image sensor according to exemplary embodiments of the present inventive concepts includes a first substrate 100, a photoelectric conversion element PD, a first insulating layer 105, a first insulating structure 110, a first gate structure 115, a first element isolation layer 120, a second element isolation layer 130, a trench barrier layer 135, a passivation layer 140, a first color filter 150, a grid pattern 155, a microlens 160, a pattern structure 170, a pad 180, an adhesive layer 190, a second color filter 191 and a transparent layer 192.

The first substrate 100 includes a first surface 100a and a second surface 100b opposite to each other. For example, as shown in the exemplary embodiment of FIG. 4, the first surface 1003 may be an upper surface, e.g., in a third direction Z (hereinafter, the "Z direction") which is perpendicular to the X and Y directions and is a vertical direction. In an exemplary embodiment, the first substrate 100 may be bulk silicon or SOI (silicon-on-insulator). For example, the first substrate 100 may be a silicon substrate or may include other materials, such as at least one compound selected from silicon germanium, indium antimonide, lead telluride, indium arsenide, indium phosphide, gallium arsenide and gallium antimonide. However, exemplary embodiments of the present inventive concepts are not limited thereto. Alternatively, the first substrate 100 may have an epitaxial layer formed on a base substrate.

The photoelectric conversion device PD may be disposed in the first substrate 100. The photoelectric conversion element PD may be disposed in the first substrate 100 in the first region I. Further, the photoelectric conversion element PD may be disposed in the first substrate 100 in the second region II. However, the photoelectric conversion element PD is not disposed in the first substrate 100 in the third region III and the third region does not include a photoelectric conversion element PD. However, exemplary embodiments of the present inventive concepts are not limited thereto.

Although in an exemplary embodiment the photoelectric conversion element PD may be photodiode, exemplary embodiments of the present inventive concepts are not limited thereto. A plurality of photoelectric conversion elements PD may be disposed in the first substrate 100. Each photoelectric conversion element PD may be separated from each other by the first element isolation layer 120 and the second element isolation layer 130.

A plurality of first gate structures 115 may be disposed on the second surface 100b of the first substrate 100 and are spaced apart from each other. For example, as shown in the exemplary embodiment of FIG. 4, each of the plurality of first gate structures 115 may be disposed to be spaced apart from each other in the X direction. Each of the plurality of first gate structures 115 may extend in the Y direction. In exemplary embodiment, each of the plurality of first gate structures 115 may be a gate of a charge transmission element, a gate of a reset element, a gate of a drive element or the like.

Although the exemplary embodiment of FIG. 4 shows that each of the plurality of first gate structures 115 is disposed on the second surface 100b of the first substrate 100, exemplary embodiments of the present inventive concepts are not limited thereto. For example, in another exemplary embodiment, each of the plurality of first gate structures 115 may be in the form of being recessed in the first substrate 100 or in the form of being embedded in the first substrate 100 and may not be disposed on the second surface 100b of the first substrate 100. For example, each of the plurality of first gate structures 115 may be disposed between the first surface 100a and the second surface 100b (e.g., in the Z direction).

The first insulating structure 110 may be disposed on the second surface 100b of the first substrate 100. The first insulating structure 110 may include a first metal wiring 112, and a first interlayer insulating layer 114 disposed to surround the first metal wiring 112.

In an exemplary embodiment, the first metal wiring 112 may include at least one compound selected from aluminum (Al), copper (Cu), tungsten (W), cobalt (Co), ruthenium (Ru), and the like. However, exemplary embodiments of the present inventive concepts are not limited thereto.

The first metal wiring 112 may include a plurality of wirings that are sequentially stacked (e.g., in the Z direction). Although the exemplary embodiment of FIG. 4 shows that the first metal wiring 112 includes three layers that are sequentially stacked (e.g., in the Z direction), this is merely for convenience of description, and the present inventive concepts are not limited thereto.

In an exemplary embodiment, the first interlayer insulating layer 114 may include, at least one compound selected from silicon oxide ($SiO_2$), silicon nitride (SiN), silicon oxynitride (SiON), low dielectric constant material, and a combination thereof.

The first insulating layer 105 may be disposed between the second surface 100b of the first substrate 100 and the first insulating structure 110 (e.g., in the Z direction). The first insulating layer 105 may be disposed to cover each of the plurality of first gate structures 115 disposed on the second surface 100b of the first substrate 100.

In an exemplary embodiment, the first insulating layer 105 may include at least one compound selected from silicon oxide (SiO$_2$), silicon nitride (SiN), oxynitride (SiON), and a low dielectric constant material.

The first element isolation layer 120 may be disposed inside a first trench TR1 formed in the second surface 100b of the first substrate 100. A lower surface of the first element isolation layer 120 may directly contact an upper surface of the first insulating layer 105.

In an exemplary embodiment, the first element isolation layer 120 may include at least one compound selected from silicon oxide (SiO2), silicon nitride (SiN), silicon carbide (SiC), silicon oxycarbide (SiOC), silicon oxynitride (SiON) and silicon oxycarbonitride (SiOCN).

A second trench TR2 may be formed on the first trench TR1 between each of the plurality of photoelectric conversion elements PD (e.g., in the X direction). The second trench TR2 may extend from the second surface 180b of the first substrate 100 into the first substrate 100 in the Z direction. As shown in the exemplary embodiment of FIG. 4, the second trench TR2 may extend to the first surface 100a of the first substrate 100 and may extend over an upper surface of the second element isolation layer 130. However, exemplary embodiments of the present inventive concepts are not limited thereto.

As shown in the exemplary embodiment of FIG. 4, a width of the second trench TR2 in the X direction may be smaller than a width of the first trench TR1 in the X direction.

As shown in the exemplary embodiment of FIG. 4, the second, element isolation layer 130 may be disposed inside the second trench TR2. The second element isolation layer 130 may, include a material different from that of the first element isolation layer 120. In an exemplary embodiment, the second element isolation layer 130 may include a material having excellent gap-fill performance, such as polysilicon (poly-Si). However, exemplary embodiments of the present inventive concepts are not limited thereto.

The trench barrier layer 135 may be disposed in the second trench TR2 along a lateral side wall and an upper surface of the second trench TR1 For example, the trench barrier layer 135 may be disposed in the second trench TR2, between the lateral side wall of the second element isolation layer 130 and the first substrate 100 (e.g., in the X direction), between the second element isolation layer 130 and the first element isolation layer 120 (e.g., in the X direction), and between the second element isolation layer 130 and the passivation layer 140 (e.g., in the Z direction). The trench barrier layer 135 may surround the upper surface and lateral side walls of the second element isolation layer 130.

Although the exemplary embodiment of FIG. 4 shows that the trench barrier layer 135 is conformally formed in the second trench TR2, exemplary embodiments of the present inventive concepts are not limited thereto.

In an exemplary embodiment, the trench barrier layer 135 may include the same material as the material of the passivation layer 140, such as a high dielectric constant insulating material. However, exemplary embodiments of the present inventive concepts are not limited thereto. For example, in other exemplary embodiments, the trench barrier layer 135 may include a material that is different from the material of the passivation layer 140.

The passivation layer 140 may be disposed on the first surface 100a of the first substrate 100. For example, as shown in the exemplary embodiment of FIG. 4, a lower surface of the passivation layer 140 may directly contact the first surface 100a of the first substrate 100. In an exemplary embodiment, the passivation layer 140 may include a high dielectric constant insulating material. Further, the passivation layer 140 may include an amorphous crystal structure. For example, at least a part of the high dielectric constant insulating material included in the passivation layer 140 may have an amorphous crystal structure. However, exemplary embodiments of the present inventive concepts are not limited thereto.

Although the exemplary embodiment of FIG. 4 shows that the passivation layer 140 is formed as a single layer, exemplary embodiments of the present inventive concepts are not limited thereto. For example, in another exemplary embodiment, the passivation layer 140 may further include a planarization layer and an antireflection layer. In this embodiment, the planarization layer may include at least one of a silicon oxide film-based material, a silicon nitride film-based material, a resin or a combination thereof. Although the antireflection layer may include a high dielectric constant material, such as hafnium oxide (HfO$_2$), exemplary embodiments of the present inventive concepts are not limited thereto.

The first color filter 150 may be disposed in a first region I which is an active pixel sensor region of the sensor array region. The first color filter 150 may not be disposed in the second region II which is an optical black sensor region of the sensor array region.

As shown in the exemplary embodiment of FIG. 4, the first color filter 150 may be disposed on an upper surface 140a of the passivation layer 140. For example, a lower surface of the first color filter 150 may directly contact the upper surface 140a of the passivation layer 140. However, exemplary embodiments of the present inventive concepts are not limited thereto.

The first color filter 150 may be arranged to correspond to each unit pixel. For example, the first color filter 150 may be two-dimensionally arranged (e.g., in the form of a matrix) on a plane defined by the X direction and the Y direction.

In an exemplary embodiment, the first color filter 150 may include a red color filter, a green color filter or a blue color filter depending on the unit pixel. Further, the first color filter 150 may include a yellow filter, a magenta filter and a cyan filter, and may further include a white filter.

The grid pattern 155 is formed on the first surface 100a of the first substrate 100 in a grid shape, and may be disposed to surround each unit pixel. For example, the grid pattern 155 may be disposed between the first color filters 150 on the upper surface 140a of the passivation layer 140. The grid pattern 155 reflects incident light which is obliquely incident on the first substrate 100, and may increase the amount of incident light transmitted to the photoelectric conversion element PD.

The microlens 160 may be disposed in the first region I which is an active pixel sensor region of the sensor array region. The microlens 160 may not be disposed in the second region II which is an optical black sensor region of the sensor array region.

The microlens 160 may be disposed on the first color filter 150. For example, as shown in the exemplary embodiment of FIG. 4, a lower surface of the microlens 160 may directly contact an upper surface of the first color filter 150. However, exemplary embodiments of the present inventive concepts are not limited thereto. The microlens 160 may be arranged to correspond to each unit pixel. For example, the microlens 160 may be arranged two-dimensionally (e.g., in the form of a matrix) in the plane defined by the X and the Y directions.

The microlens 160 may have a convex shape, and may have a predetermined radius of curvature. Therefore, the microlens 160 may concentrate the incident light on the photoelectric conversion element PD.

Although in an exemplary embodiment the microlens 160 may include an organic material such as a photosensitive resin or an inorganic material, exemplary embodiments of the present inventive concepts are not limited thereto.

As shown in the exemplary embodiment of FIG. 4, the pattern structure 170 may be disposed on the upper surface 140a of the passivation layer 140 in the second region II. The pattern structure 170 may be disposed to protrude (e.g., in the 7, direction) from the upper surface 140a of the passivation layer 140. As shown in the exemplary embodiment of FIG. 7, the pattern structure 170 may include a first layer 171 disposed on the upper surface 140a of the passivation layer 140, and a second layer 172 disposed on the first layer 171.

In an exemplary embodiment, the pattern structure 170 may include a metal. For example, in an exemplary embodiment, each of the first layer 171 and the second layer 172 may include a metal. The first layer 171 and the second layer 172 may include metals different from each other. For example, in an exemplary embodiment, the first layer 171 may include titanium (Ti), and the second layer 172 may include tungsten (W). However, exemplary embodiments of the present inventive concepts are not limited thereto and the first and second layers 171, 172 may have different metals in other exemplary embodiments.

At least one lateral side wall 170s of the pattern structure 170 may have a sloped profile. For example, a width of the pattern structure 170 in the X direction may increase as the pattern structure 170 gets closer to the upper surface 140a of the passivation layer 140. For example, as shown in the exemplary embodiment of FIG. 5, the at least one lateral side wall of the pattern structure 170 may have a curved surface shape.

A lower surface of the pattern structure 170 may directly contact the passivation layer 140. For example, a lower surface 171a of the first layer 171 of the pattern structure 170 may directly contact the upper surface 140a of the passivation layer 140. In an exemplary embodiment, a first thickness t1 of the pattern structure 170 (e.g., length in the third direction Z) may be in a range of about 2000 Å to about 4000 Å.

The adhesive layer 190 may be disposed on the passivation layer 140 to cover the pattern structure 170. In an exemplary embodiment, the adhesive layer 190 may include aluminum oxide ($Al_2O_3$). However, exemplary embodiments of the present inventive concepts are not limited thereto.

The second color filter 191 may be disposed in the second region II which is an optical black sensor region of the sensor array region. The second color filter 191 may be disposed on the adhesive layer 190. For example, as shown in the exemplary embodiment of FIG. 5, the second color filter 191 may be disposed directly on the adhesive layer 190.

The second color filter 191 may be in direct contact with the upper surface of the adhesive layer 190. For example, a lower surface of the second color filter 191 may directly contact the upper surface of the adhesive layer 190. In an exemplary embodiment, the upper surface of the second color filter 191 may be formed to be higher than the upper surface of the first color filter 150. For example, the distance (e.g., in the Z direction) between the upper surface of the second color filter 191 and the first surface 100a of the first substrate 100 may be greater than the distance (e.g., in the Z direction) between the upper surface of the first color filter 150 and the first surface 100a of the first substrate 100. However, exemplary embodiments of the present inventive concepts are not limited thereto. In are exemplary embodiment, the second color filter 191 may include a blue color filter.

The transparent layer 192 may be disposed on the adhesive layer 190 and the second color filter 191. For example, in an exemplary embodiment, the transparent layer 192 may be disposed to completely cover the second color filter 191. However, exemplary embodiments of the present inventive concepts are not limited thereto. In an exemplary embodiment, the transparent layer 192 may include a material that transmits light.

In an image sensor according to an exemplary embodiment of the present inventive concepts, by disposing the pattern structure 170 having at least one lateral side wall of a sloped profile in at least one of an optical black sensor region, a pad region, and a connection region, it is possible to uniformly form the thickness variation of the configuration formed by the spin coating process.

Hereinafter, an image sensor according to some other exemplary embodiments of the present inventive concepts will be described with reference to the exemplary embodiments of FIGS. 6 and 7. Differences from the image sensor shown in the exemplary embodiments of FIGS. 4 and 5 will be mainly described and a description of elements that are identical or substantially to those shown in the exemplary embodiments of FIGS. 4 and 5 will be omitted for convenience of explanation.

Figure 6:
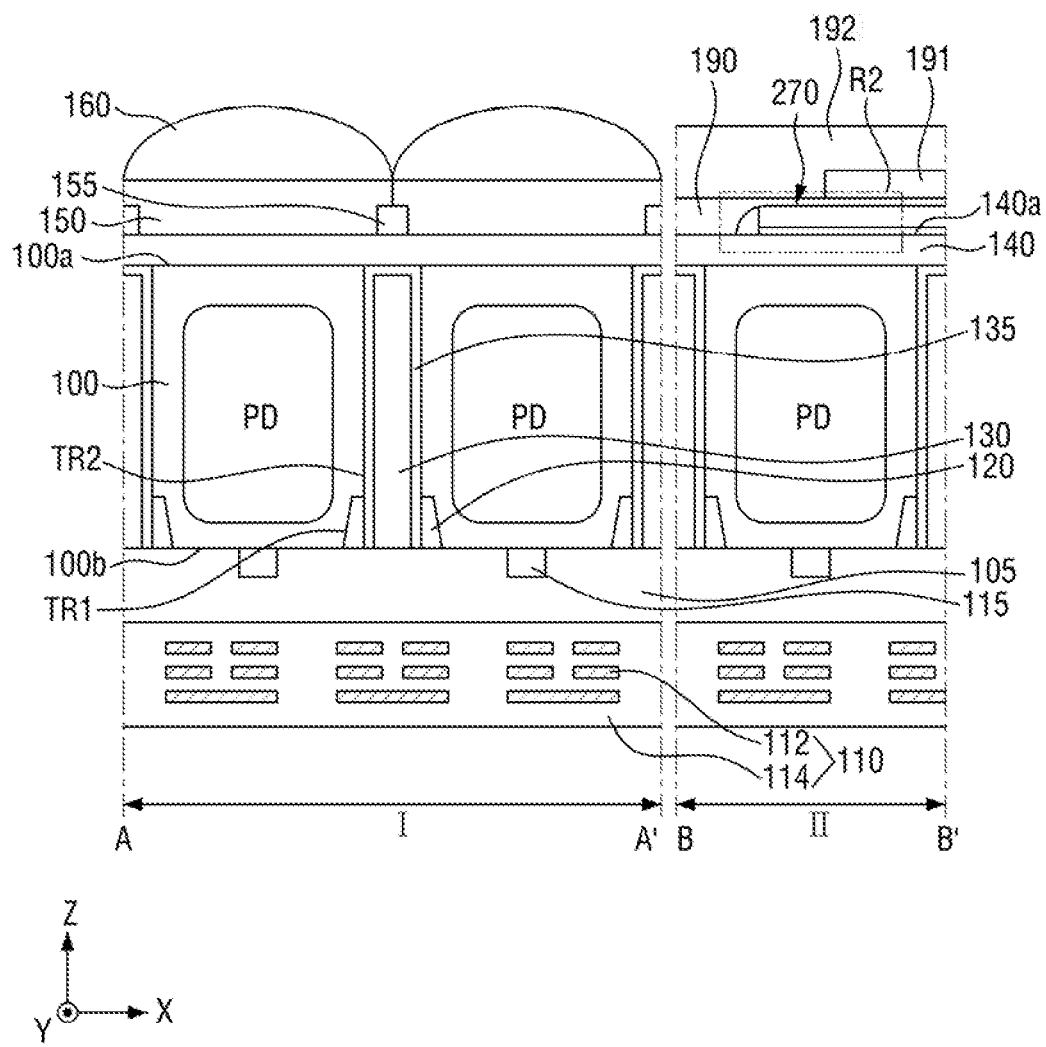
FIG. 6 is a cross-sectional view of an image sensor according to an exemplary embodiment of the present inventive concepts.

FIG. 6 is a cross-sectional view of an image sensor according to another exemplary embodiment of the present inventive concepts. FIG. 7 is an enlarged view in which a region R2 of FIG. 6 is enlarged according an exemplary embodiment of the present inventive concepts.

Figure 7:
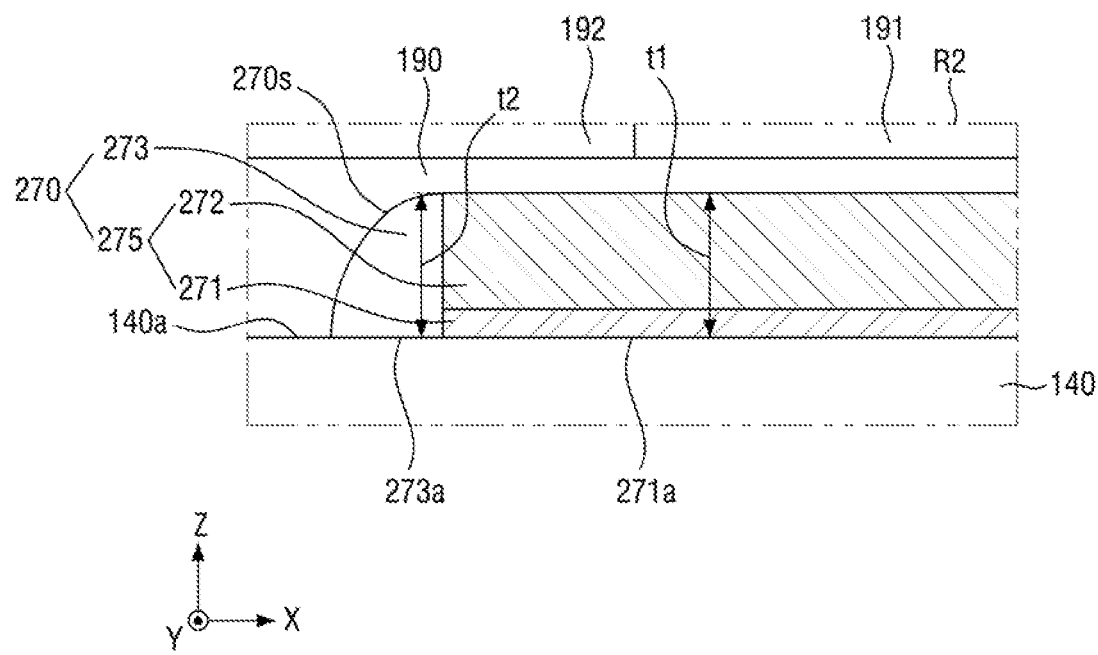
FIG. 7 is an enlarged view of region R2 of FIG. 6 according to an exemplary embodiment of the present inventive concepts.

Referring to the exemplary embodiments of FIGS. 6 and 7, in an image sensor according to some other exemplary embodiments of the present inventive concepts, a pattern structure 270 may include a metal film pattern 275 and a spacer pattern 273.

At least one lateral side wall 270s of the pattern structure 270 may have a sloped profile. For example, a width of the pattern structure 270 in the X direction may increase as the pattern structure 270 gets closer to the upper surface 140a of the passivation layer 140. The at least one lateral side wall of the pattern structure 170 may have a curved surface shape.

A metal film pattern 275 may be disposed on the upper surface 140a of the passivation layer 140. The metal film pattern 275 may include a first layer 271, and a second laver. 272 disposed on the first layer 271.

The metal film pattern 275 may include a metal. For example, each, of the first layer 271 and the second layer 272 may include a metal, in an exemplary embodiment, the first layer 271 and the second layer 272 may include metals that are different from each other. In an exemplary embodiment, the first layer 271 may include titanium JO and the second layer 272 may include tungsten (W). However, exemplary embodiments of the present inventive concepts are not limited thereto.

A first thickness t1 of the metal film pattern 275 (e.g., length in the Z direction) may be in a range of about 2000 Å to about 4000 Å.

The spacer pattern 273 may be disposed on at least one lateral side of the metal film pattern 275 in the X direction.

A lateral side wall 270s of the spacer pattern 273 may have a sloped profile of a curved surface shape.

A lower surface 273a of the spacer pattern 273 may be formed on the same plane as the lower surface of the metal film pattern 275. For example, the lower surface 273a of the spacer pattern 273 may be formed on the same plane as the lower surface 271a of the first layer 271 and the lower surface 273a of the spacer pattern 273 may be coplanar (e.g., in the Z direction) with the lower surface 271a of the first layer 271.

A second thickness t2 of the spacer pattern 273 which is a maximum thickness (e.g., length in the Z direction) of the spacer pattern 273 having the sloped profile may be the same as the first thickness t1 of the metal film pattern 275 (e.g., length in the Z direction).

Hereinafter, an image sensor according to some other exemplary embodiments of the present inventive concepts will be described with reference to the exemplary embodiments of FIGS. 8 and 9. Differences from the image sensor shown in the exemplary embodiments of FIGS. 4 and 5 will be mainly described and a description of elements that are identical or substantially to those shown in the exemplary embodiments of FIGS. 4 and 5 will be omitted for convenience of explanation.

Figure 8:
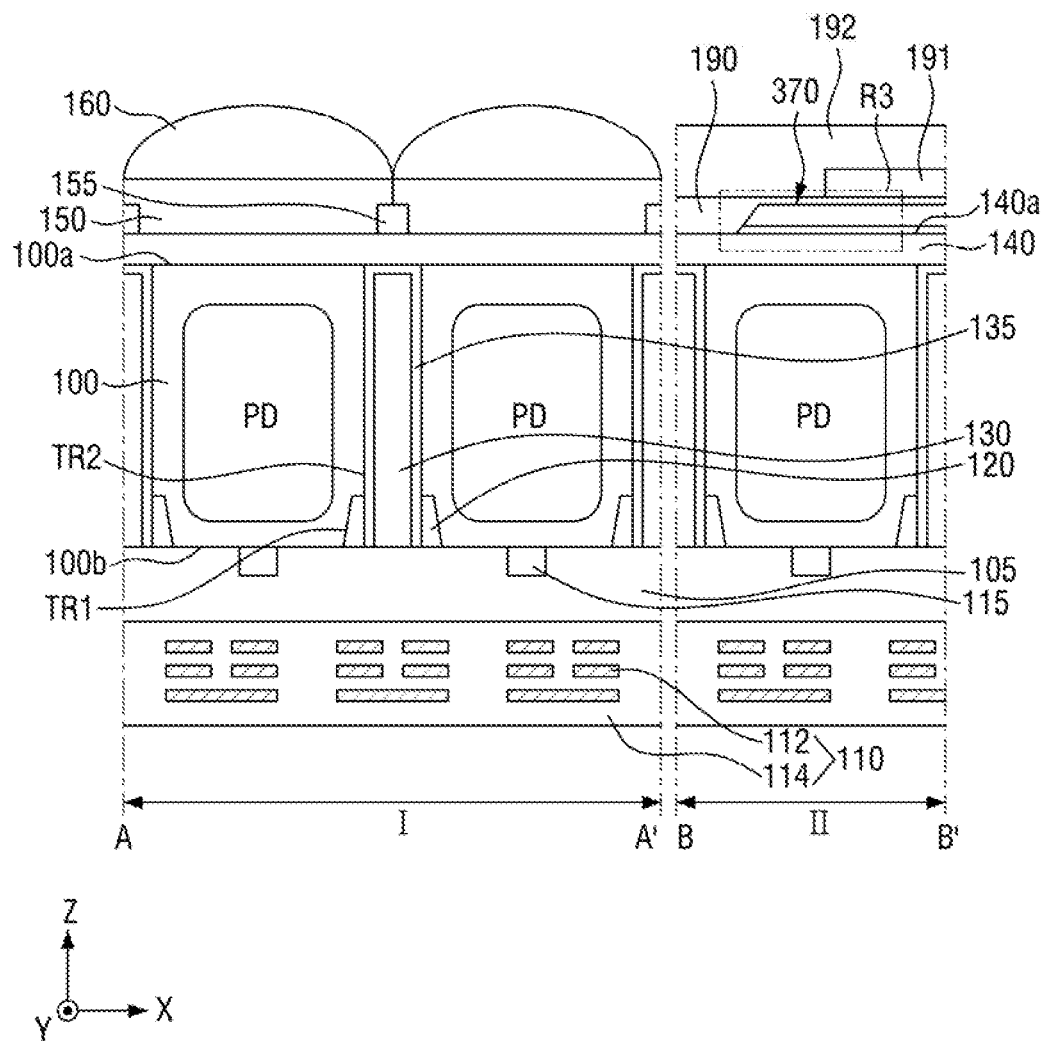
FIG. 8 is a cross-sectional view of an image sensor according to an exemplary embodiment of the present inventive concepts.

FIG. 8 is a cross-sectional view for explaining an image sensor according to another exemplary embodiment of the present inventive concepts. FIG. 9 is an enlarged view in which a region R3 of FIG. 8 is enlarged according to an exemplary embodiment of the present inventive concepts.

Figure 9:
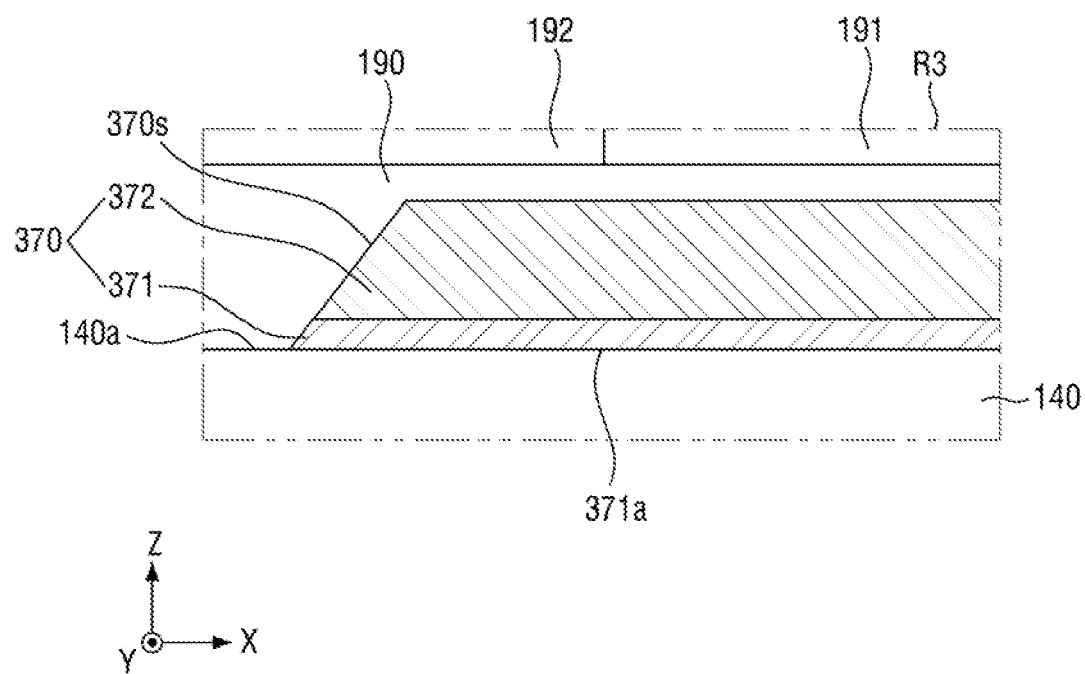
FIG. 9 is an enlarged view of region R3 of FIG. 8 according to an exemplary embodiment of the present inventive concepts.

Referring to the exemplary embodiments of FIGS. 8 and 9, in an image sensor according to some other exemplary embodiments of the present inventive concepts, at least one lateral side wall 370a of the pattern structure 370 may have a planar shape which has a constant oblique angle with respect to the upper surface 140a of the passivation layer 140.

The pattern structure 370 may include a first layer 371 disposed on the upper surface 140a of the passivation layer 140, and a second layer 372 disposed on the first layer 371. The lower surface 371a of the first layer 371 may directly contact the upper surface 140a of the passivation layer 140.

Hereinafter, an image sensor according to some other exemplary embodiments of the present inventive concepts will be described with reference to the exemplary embodiments of FIGS. 10 and 11. Differences from the image sensor shown in FIGS. 4 and 5 will be mainly described and a description of elements that are identical or substantially to those shown in the exemplary embodiments of FIGS. 4 and 5 will be omitted for convenience of explanation.

Figure 10:
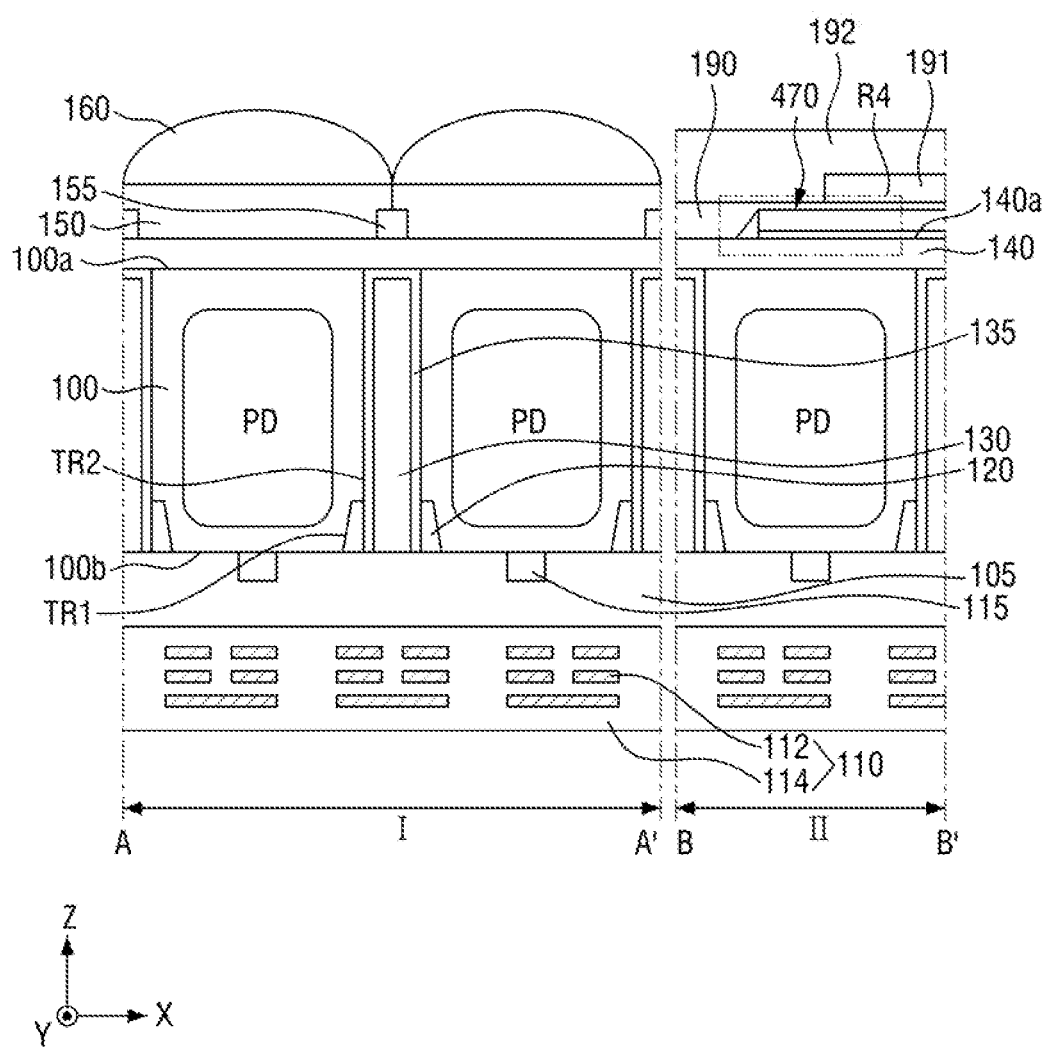
FIG. 10 is a cross-sectional view of an image sensor according to an exemplary embodiment of the present inventive concepts.

FIG. 10 is a cross-sectional view of an image sensor according to an exemplary embodiment of the present inventive concepts. FIG. 11 is an enlarged view in which a region R4 of FIG. 10 is enlarged according to an exemplary embodiment of the present inventive concepts.

Figure 11:
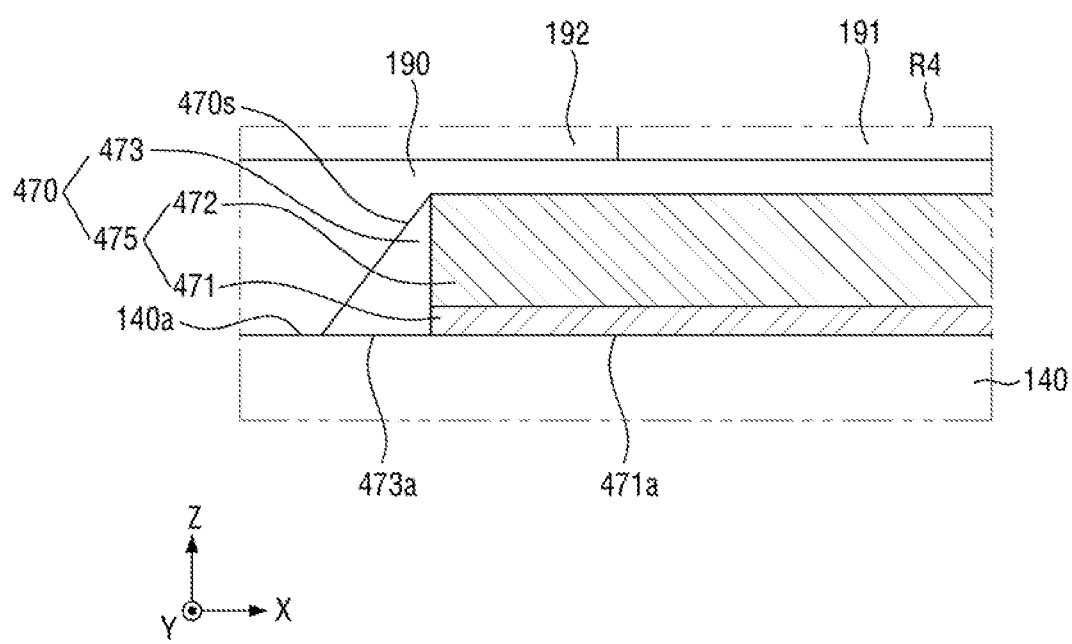
FIG. 11 is an enlarged view of region R4 of FIG. 10 according to an exemplary embodiment of the present inventive concepts.

Referring to FIGS. 10 and 11, in an image sensor according to some exemplary embodiments of the present inventive concepts, the pattern structure 470 may include a metal film pattern 475 and a spacer pattern 473.

At least one lateral side wall 470s of the pattern structure 470 may have a planar shape which has a constant oblique angle with respect to the upper surface 140a of the passivation layer 140.

The metal film pattern 475 may be disposed on the upper surface 140a of the passivation layer 140. The metal film pattern 475 may include a first layer 471 and a second layer 472 disposed on the first layer 471. Each of the first layer 471 and the second layer 472 may include a metal. In an exemplary embodiment, the first layer 471 and the second layer 472 may include different metals from each other. In an exemplary embodiment, the first layer 471 may include titanium (Ti) and the second layer 472 may include tungsten (W). However, exemplary embodiments of the present inventive concepts are not limited thereto.

The spacer pattern 473 may be, disposed on at lent one side of the metal film pattern 475 in the X direction. A lateral side wall 470s of the spacer pattern 473 may have a planar shape which has a constant oblique angle with respect to the upper surface 140a of the passivation layer 140.

The lower surface 473a of the spacer pattern 473 may be formed on the same plane as the lower surface of the metal film pattern 475. For example, the lower surface 473a of the spacer pattern 473 may be formed on the same plane as the lower surface 471a of the first layer 471 and the lower surface 473a of the spacer pattern 473 may be coplanar (e.g., in the Z direction) with the lower surface 471a of the first layer 471.

A maximum thickness of the spacer pattern 473 (e.g., length in the Z direction) ma be the same as a thickness of the metal film pattern 475 in the Z direction.

Hereinafter, an image sensor according to some other exemplary embodiments of the present inventive concepts will be described with reference to the exemplary embodiments of FIGS. 12 and 13. Differences from the image sensor shown in the exemplary embodiments of FIGS. 4 and 5 will be mainly described and a description of elements that are identical or substantially to those shown in the exemplary embodiments of FIGS. 4 and 5 will be omitted for convenience of explanation.

Figure 12:
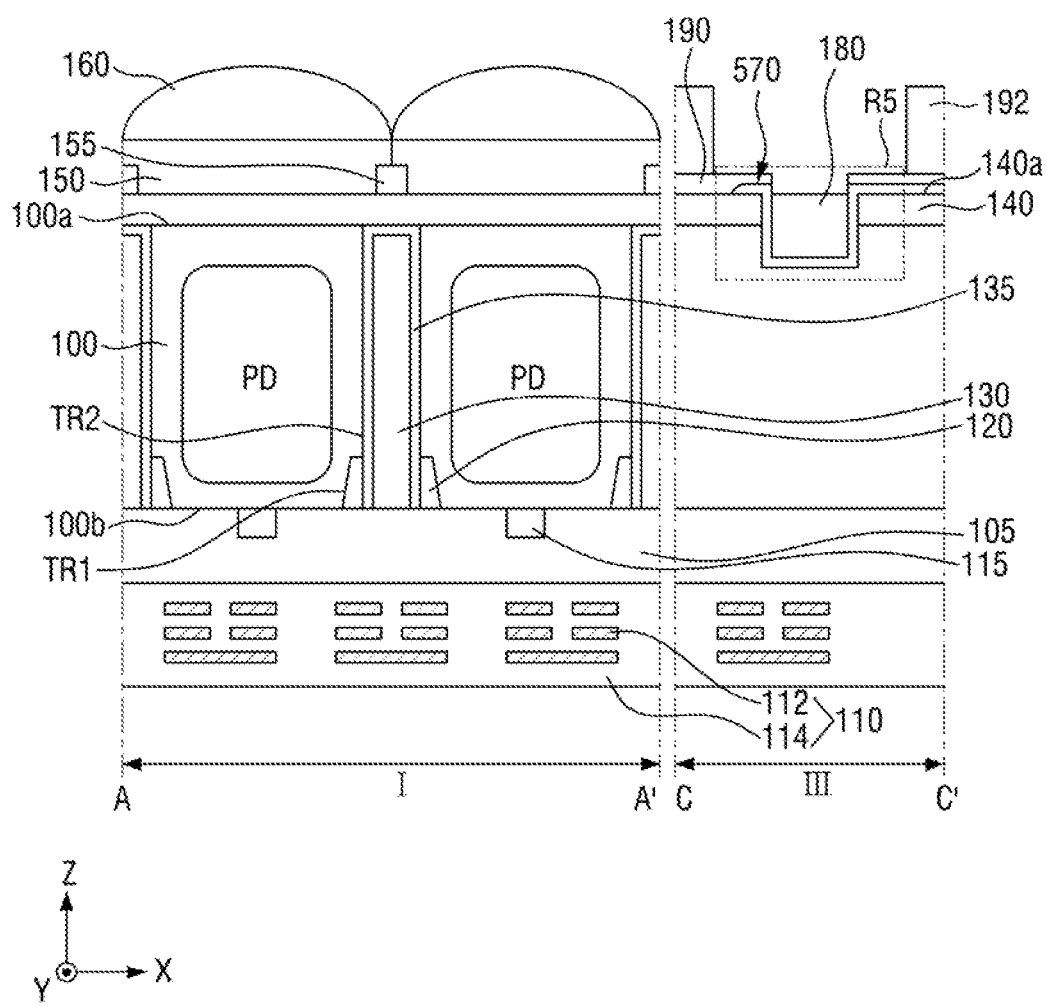
FIG. 12 is a cross-sectional view of an image sensor taken along line A-A and line C-C' of FIG. 3 according to an exemplary embodiment of the present inventive concepts.

FIG. 12 is a cross-sectional view of an image sensor according to an exemplary embodiments of the present inventive concepts. FIG. 13 is an enlarged view in which a region R5 of FIG. 12 is enlarged according to an exemplary embodiments of the present inventive concepts.

Figure 13:
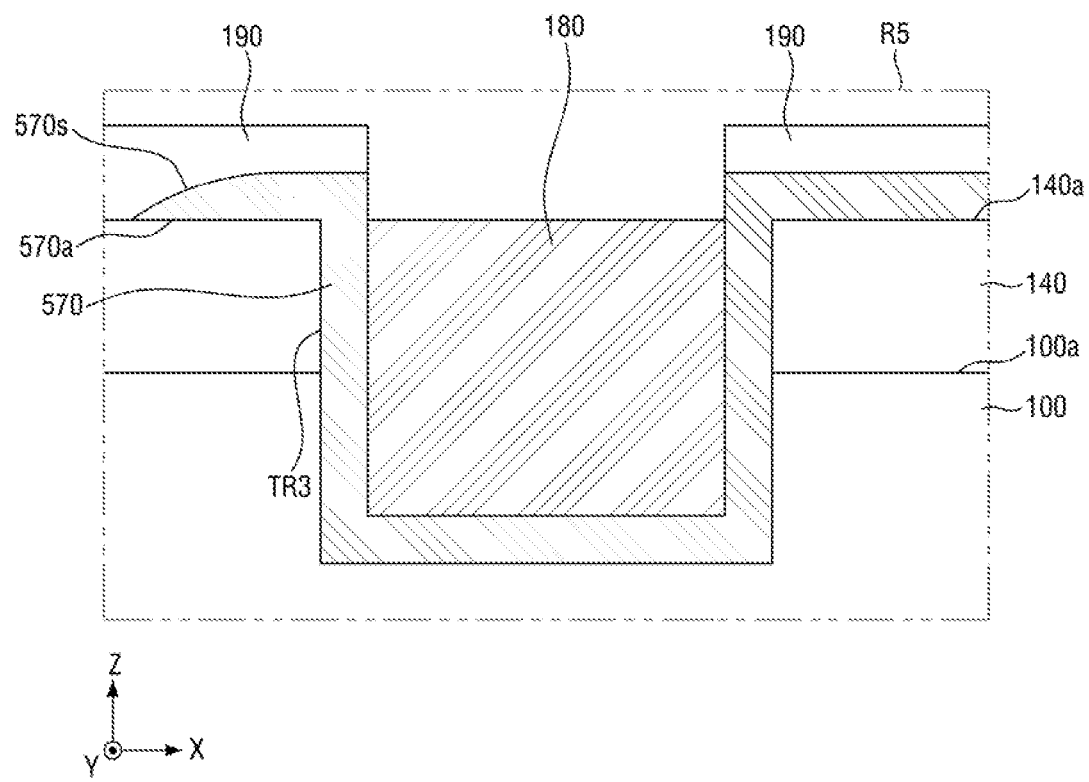
FIG. 13 is an enlarged view of region R5 of FIG. 12 according to an exemplary embodiment of the present inventive concepts.

Referring to the exemplary embodiments of FIGS. 12 and 13, an image sensor according to some other exemplary embodiments of the present inventive concepts may have a pattern structure 570 disposed in a third region III which is a pad region.

A third trench TR3 may be formed inside the passivation layer 140. The third trench TR3 may extend to the inside of the first substrate 100. For example, the third trench TR3 may be disposed at a height between the first surface 100a and the second surface bob of the first substrate 100.

The pattern structure 570 may be disposed along the lateral side wall and the bottom surface of the third trench TR3. A portion of the pattern structure 570 may extend along the upper surface 140a of the passivation layer 140. For example, as shown in the exemplary embodiment of FIG. 13, a lower surface 570a of the pattern structure 570 disposed along the upper surface 140a of the passivation layer 140 may be in direct contact with the upper surface 140a of the passivation layer 140.

A partial lateral side wall 570s of the pattern structure 570 disposed on the upper surface 140a of the passivation layer 140 may have a sloped profile. The partial lateral side wall 570s of the pattern structure 570 may have, for example, a curved surface shape.

The pad 180 may be disposed on the pattern structure 570 inside the third trench TR3. As shown in the exemplary embodiment of FIG. 13, the pattern structure 570 is not disposed on the upper surface of the pad 180. However, exemplary embodiments of the present inventive concepts are not limited thereto.

The adhesive layer 190 may be disposed on the passivation layer 140 to cover the pattern structure 570. The adhesive layer 190 is not disposed on the pad 180. For example, as shown in the exemplary embodiment of FIG. 13, the upper surface of the pad 180 may be exposed. As shown in the exemplary embodiment of FIG. 12, a transparent layer 192 may be disposed on the adhesive layer 190. The transparent layer 192 may not be disposed on the pad 180.

Hereinafter, an image sensor according to some other exemplary embodiments of the present inventive concepts will be described with reference to FIGS. 14 and 15. Differences from the image sensor shown in FIGS. 4 and 5 will be mainly described and a description of elements that are identical or substantially to those shown in the prior exemplary embodiments will be omitted for convenience of explanation.

Figure 14:
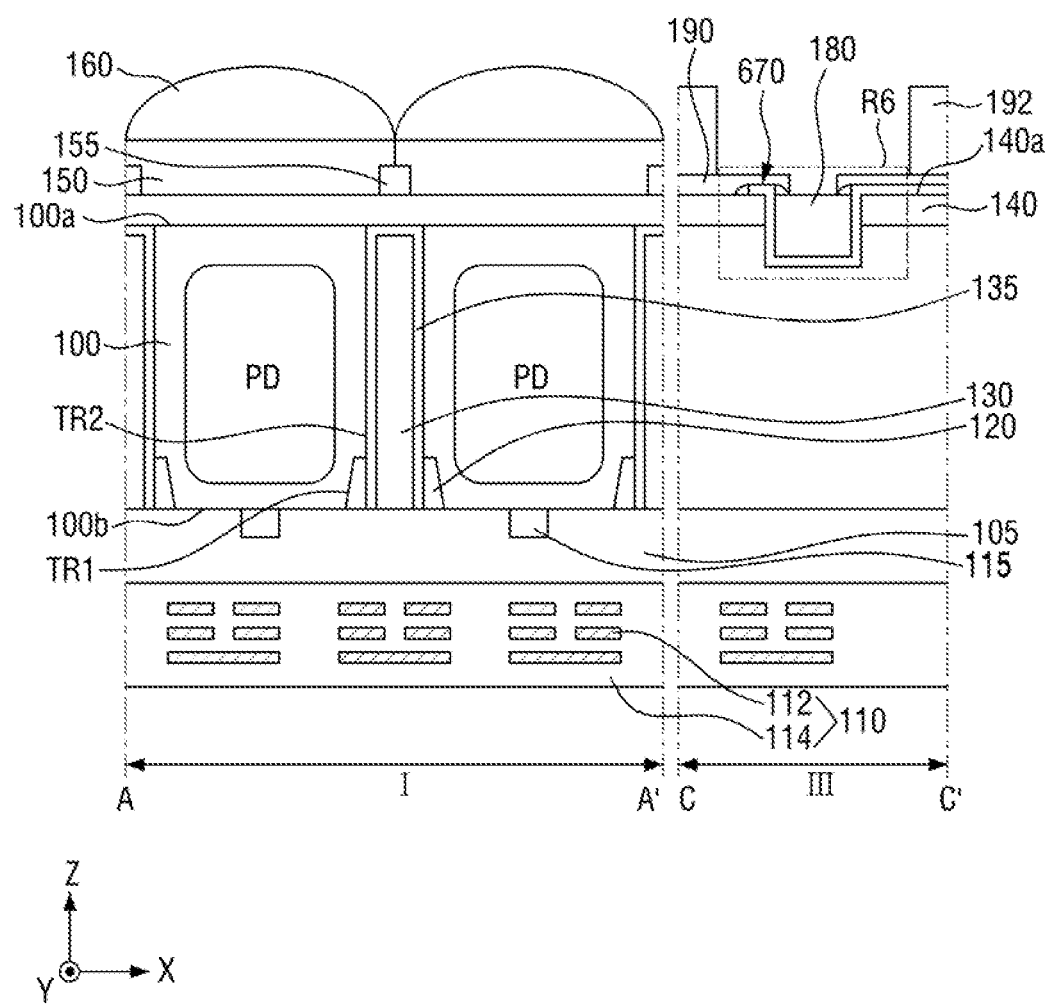
FIG. 14 is a cross-sectional view of an image sensor according to an exemplary embodiment of the present inventive concepts.

FIG. 14 is a cross-sectional view of an image sensor according to an exemplary embodiment of the present inventive concepts. FIG. 15 is an enlarged view in which a region R6 of FIG. 13 is enlarged according to an exemplary embodiment of the present inventive concepts.

Figure 15:
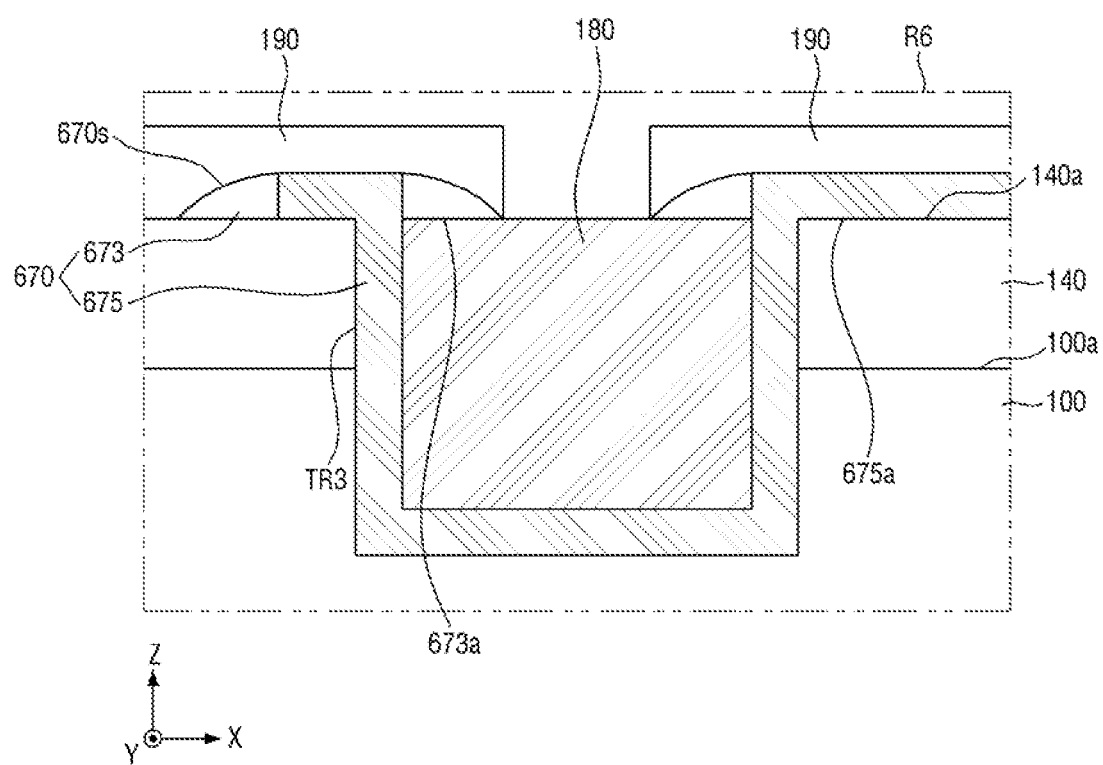
FIG. 15 is an enlarged view of region R6 of FIG. 14 according to an exemplary embodiment of the present inventive concepts.

Referring to FIGS. 14 and 15, an image sensor according to some other exemplary embodiments of the present inventive concepts May have a pattern structure 670 disposed in the third region III which is a pad region.

The pattern structure 670 may be disposed along lateral side walls and a bottom surface of the third trench TR3 formed inside the passivation layer 140.

A portion of the pattern structure 670 may extend along the upper surface 140a of the passivation layer 140. For example, lower surfaces of the pattern structure 670 disposed along the upper surface 140a of the passivation layer 140 may directly contact the upper surface 140a of the passivation layer 140.

A partial lateral side wall 670s of the pattern structure 670 disposed on the upper surface 140a of the passivation layer 140 may have a sloped profile. As shown in the exemplary embodiment of FIG. 15, the partial lateral side wall 670s of the pattern structure 670 having a sloped profile may have a curved surface shape. However, exemplary embodiments of the present inventive concepts are not limited thereto.

The pattern structure 670 may include a metal film pattern 675 and a spacer pattern 673. The metal film pattern 675 may be disposed along the lateral side walls and bottom surface of the third trench TR3. A portion of the metal film pattern 675 may extend along the upper surface 140a of the passivation layer 140. For example, a lower surface 675a of the metal film pattern 675 disposed along the upper surface 140a of the passivation layer 140 may directly contact the upper surface 140a of the passivation layer 140.

The spacer pattern 673 may be disposed on at least one lateral side in the X direction of the metal film pattern 675 disposed on the upper surface 140a of the passivation layer 140. As shown in the exemplary embodiment of FIG. 15, a partial portion of the spacer pattern 673 may be disposed on the pad 180. For example, a lower surface 673a of a partial portion of the spacer pattern 673 may directly contact an upper surface of the pad 180.

The lateral side walls 670s of the spacer pattern 671 may have a sloped profile of a curved surface shape. A lower surface 673a of the spacer pattern 673 may be formed on the same plane as the lower surface 675a of the metal film pattern 675 which is in contact with the upper surface 140a of the passivation layer 140 and the lower surfaces 673a, 675a of the spacer pattern 673 and the metal film pattern 675 may be co-planar with each other in the Z direction).

A maximum thickness of the spacer pattern 673 (e.g., length in the Z direction) may be the same as a thickness of the metal film pattern 675 disposed on the upper surface 140a of the passivation layer 140 (e.g., length in the Z direction).

The pad 180 may be disposed on the pattern structure 670 inside the third trench TR3. A portion of the pattern structure 670 may be disposed on the upper surface of the pad 180. For example, a portion of the spacer pattern 673 may be disposed on the upper surface of the pad 180. However, exemplary embodiments of the present inventive concepts are not limited thereto.

The adhesive layer 190 may be disposed on the passivation layer 140 to, cover the pattern structure 670. The adhesive layer 190 may be disposed to cover the spacer pattern 673 disposed on the pad 180 in this exemplary embodiment, at least a portion of the upper surface of the pad 180 may be exposed. For example, as shown in the exemplary embodiment of FIG. 15, a central portion (e.g., in the X direction) of the upper surface of the pad 180 may be exposed. However, exemplary embodiments of the present inventive concepts are not limited thereto. The transparent layer 192 may be disposed on the adhesive layer 190. The transparent layer 192 is not disposed on the pad 180.

Figure 16:
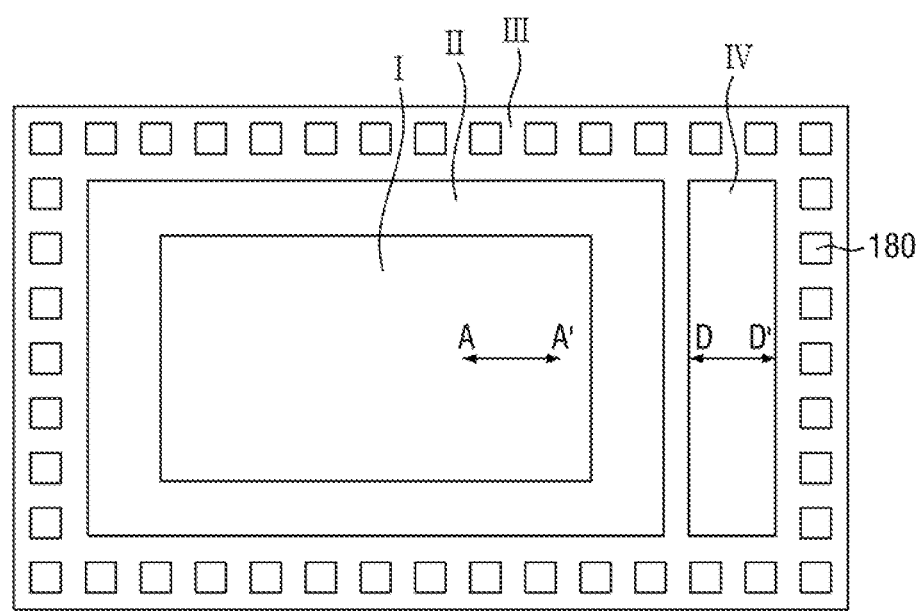
FIG. 16 is a plan view of an image sensor according to an exemplary embodiment of the present inventive concepts.
Figure 17:
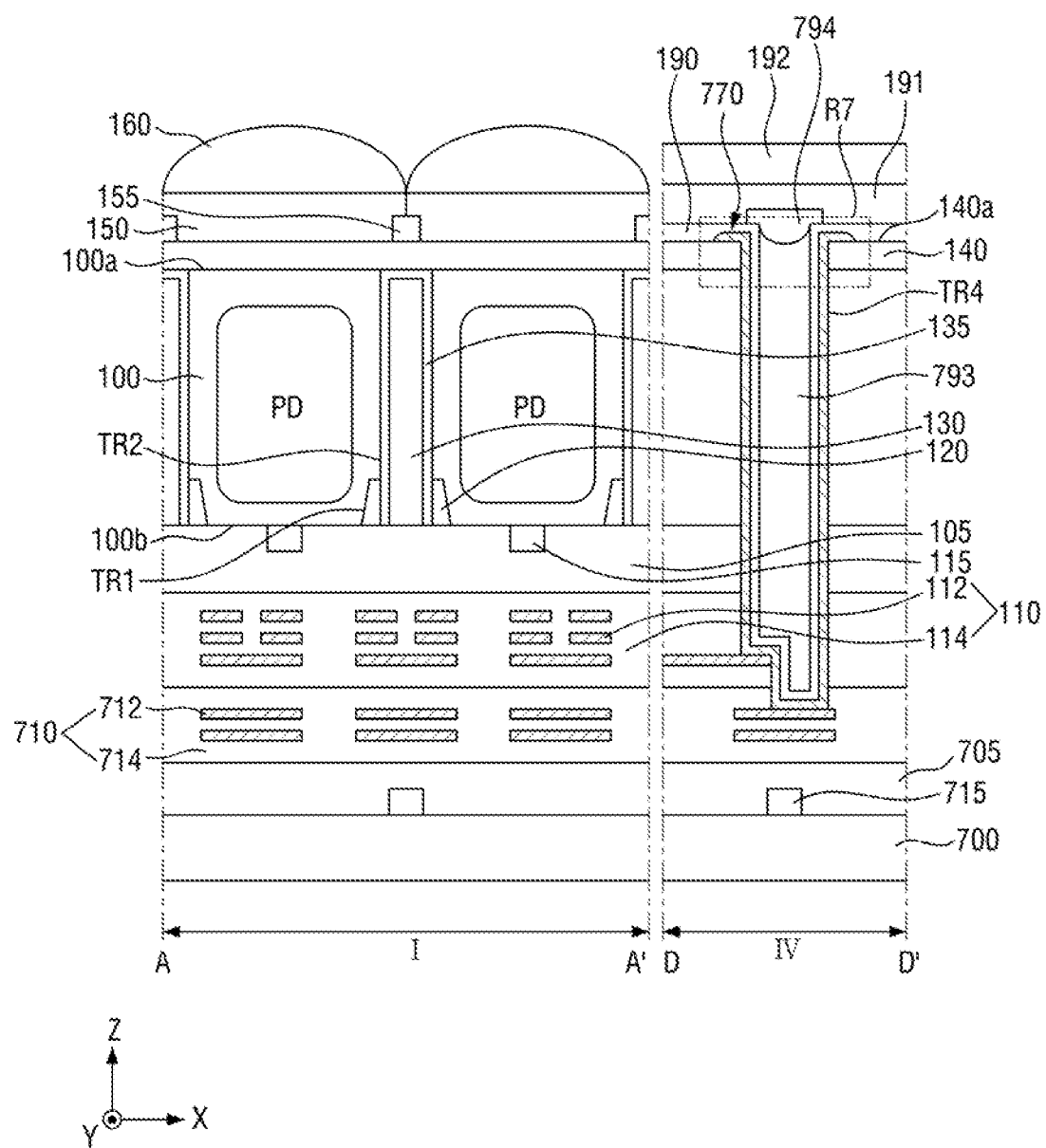
FIG. 17 is a cross-sectional view of an image sensor taken along line A-A' and line D-D' of FIG. 16 according to an exemplary embodiment of the present inventive concepts.
Figure 18:
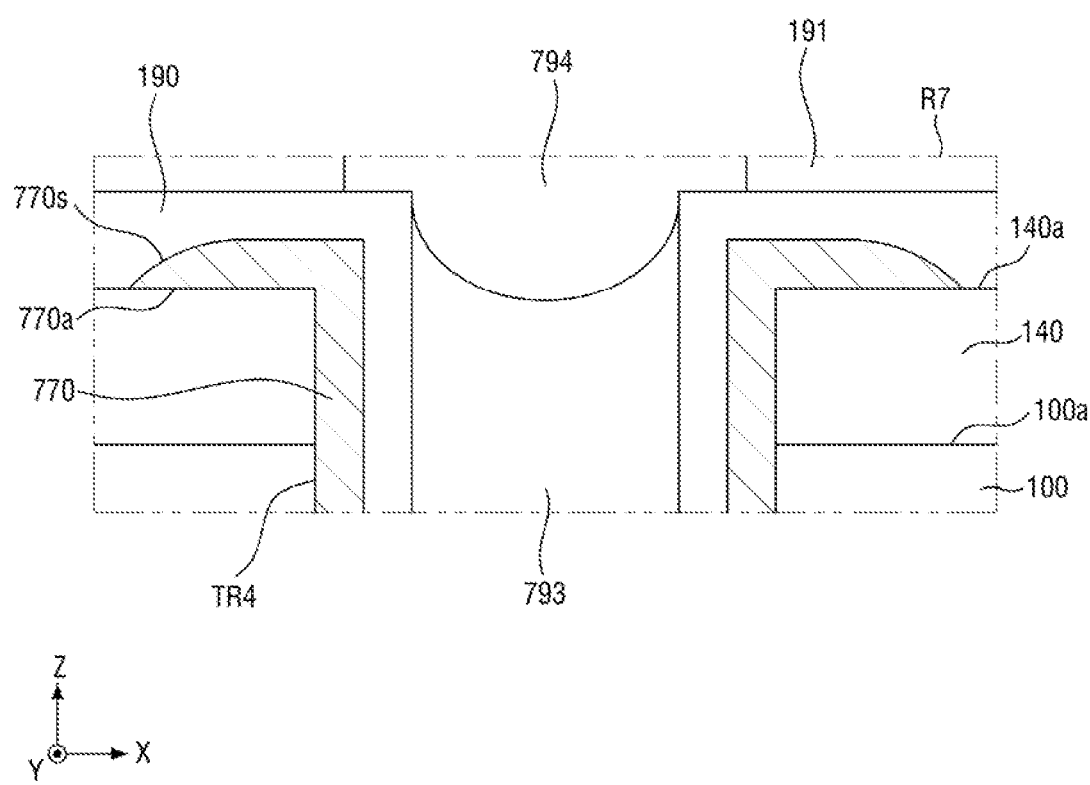
FIG. 18 is an enlarged view of region R7 of FIG. 17 according to an exemplary embodiment of the present inventive concepts.

Hereinafter, an image sensor according to some other exemplary embodiments of the present inventive concepts will be described with reference to FIGS. 16 to 18. Differences from the image sensor shown in FIGS. 3 to 5 will be mainly described and a description of elements that are identical or substantially to those shown in the prior exemplary embodiments will be omitted for convenience of explanation, FIG. 16 is a schematic plan view of an image, sensor according to an exemplary embodiment of the present inventive concepts. FIG. 17 is a cross-sectional view of an image sensor taken along line A-A' and line D-D' of FIG. 16 according to an exemplary embodiment of the present inventive concepts. FIG. 18 is an enlarged view in which a region R7 of FIG. 17 is enlarged according to, an exemplary embodiment of the present inventive concepts.

Referring to FIGS. 16 to 18, in an image sensor according to same other exemplary embodiments of the present inventive concepts, a fourth region IV, which is a connection region, may be disposed between the second region H which is an optical black sensor region and the third region III which is a pad region. For example, as shown in the exemplary embodiment of FIG. 16, the fourth region IV may be disposed between the second region II and the third region III in the X direction.

Further, the image sensor according to some other exemplary embodiments of the present inventive concepts may include a logic circuit, region disposed below the first insulating structure 110.

The logic circuit region may include a second insulating structure 710, a second insulating layer 705, a second gate structure 715 and a second substrate 700.

The second insulating structure 710 may be disposed below the first insulating structure 110. The second insulating structure 710 may include a second metal wiring 712, and a second interlayer insulating layer 714 disposed to surround the second metal wiring 712.

In an exemplary embodiment, the second metal wiring 712 may include at least one compound selected from aluminum (Al), copper (Cu), tungsten (W), cobalt (Co), ruthenium (Ru), and the like. However, exemplary embodiments of the present inventive concepts are not limited thereto.

The second metal wiring 712 may include a plurality of wirings sequentially stacked (e.g., in the Z direction). Although the exemplary embodiment of FIG. 17 shows that the second metal wiring 712 includes two layers sequentially stacked, this is merely for convenience of description, and the exemplary embodiments of the present inventive concepts are not limited thereto.

In an exemplary embodiment, the second interlayer insulating layer 714 may include at least one compound selected from silicon oxide (SiO2) silicon nitride (SiN), silicon oxynitride (SiON), and a low dielectric constant material.

The second insulating layer 705 may be disposed below the second insulating structure 710. The second insulating layer 705 may be disposed to cover each of the plurality of second gate structures 715 disposed on the upper surface of the second substrate 700.

In an exemplary embodiment, the second insulating layer 705 may include at least one compound selected from silicon oxide (SiO2), silicon nitride (SiN), silicon oxynitride (SiON), and a low dielectric constant material.

The second substrate 700 may be disposed below the second insulating layer 705. For example, in an exemplary embodiment, the second substrate 700 may be bulk silicon or SOI (silicon-on-insulator). For example, the second substrate 700 may be a silicon substrate or may include other materials, such as at least one compound selected from silicon germanium, indium antimonide, lead telluride, indium arsenide, indium phosphide, gallium arsenide and gallium antimonide. However, exemplary embodiments of the present inventive concepts are not limited thereto. Alternatively, the second substrate 700 may have an epitaxial layer formed on the base substrate.

A connection trench TR4 may penetrate (e.g., in the Z direction) the passivation layer 140, the first substrate 100, the first insulating layer 105 and the first insulating structure 110, which are disposed in the fourth region IV and may extend into the second interlayer insulating layer 714.

The connection trench TR4 may expose a portion of the first metal winos 112 inside the first insulating structure 110. Further, the connection trench TR4 may expose a portion of the second metal wiring 712 inside the second insulating structure 710.

The pattern structure 770 may be disposed along the lateral side walls and bottom surface of the connection trench TR4. A portion of the pattern structure 770 may extend along, the upper surface 140a of the passivation layer 140. For example, as shown in the exemplary embodiment of FIG. 18, the lower surface 770a of the pattern structure 770 disposed along the upper surface 140a of the passivation layer 140 may directly contact the upper surface 140a of the passivation layer 140.

A partial lateral side wall 770s of the pattern structure 770 disposed on the upper surface 140a of the passivation layer 140 may have a sloped profile. For example, in an exemplary embodiment, the lateral side wall 770s of the pattern structure 770 may have a curved surface shape.

The pattern structure 770 may electrically connect the first metal wiring 112 and the second metal wiring 712.

The adhesive layer 190 may, be disposed on the passivation layer 140 to cover the pattern structure 770. The adhesive layer 190 may be conformally disposed on the pattern structure 770 inside the connection trench TR4.

A low refractive index layer 793 may be disposed on the adhesive layer 190 inside the connection trench TR4. The low refractive index layer 793 may be disposed to fill the inside of the connection trench TR4. In art exemplary embodiment, the low refractive index layer 793 may include at least one compound selected from oxide, nitride, and are oxynitride. However, exemplary embodiments of the present inventive concepts are not limited thereto.

A photoresist 794 may be disposed on the low refractive index layer 793. A portion of the photoresist 794 may be disposed to protrude (e.g., in the Z direction) from the upper surface of the adhesive layer 190. However, exemplary embodiments of the present inventive concepts ted thereto. For example, in some other exemplary embodiments the photoresist 794 protrude or may be omitted.

A second color filter 191 may be disposed on the adhesive layer 190 and the photoresist 794. A transparent layer 192 may be disposed on the second color filter 191. Hereinafter, an image sensor according to some other exemplary embodiments of the present inventive concepts will be described with reference to FIGS. 19 and 20. Differences from the image sensor shown in FIGS. 17 and 18 will be mainly described and a description of elements that are identical or substantially to those shown in the prior exemplary embodiments will be omitted for convenience of explanation.

Figure 19:
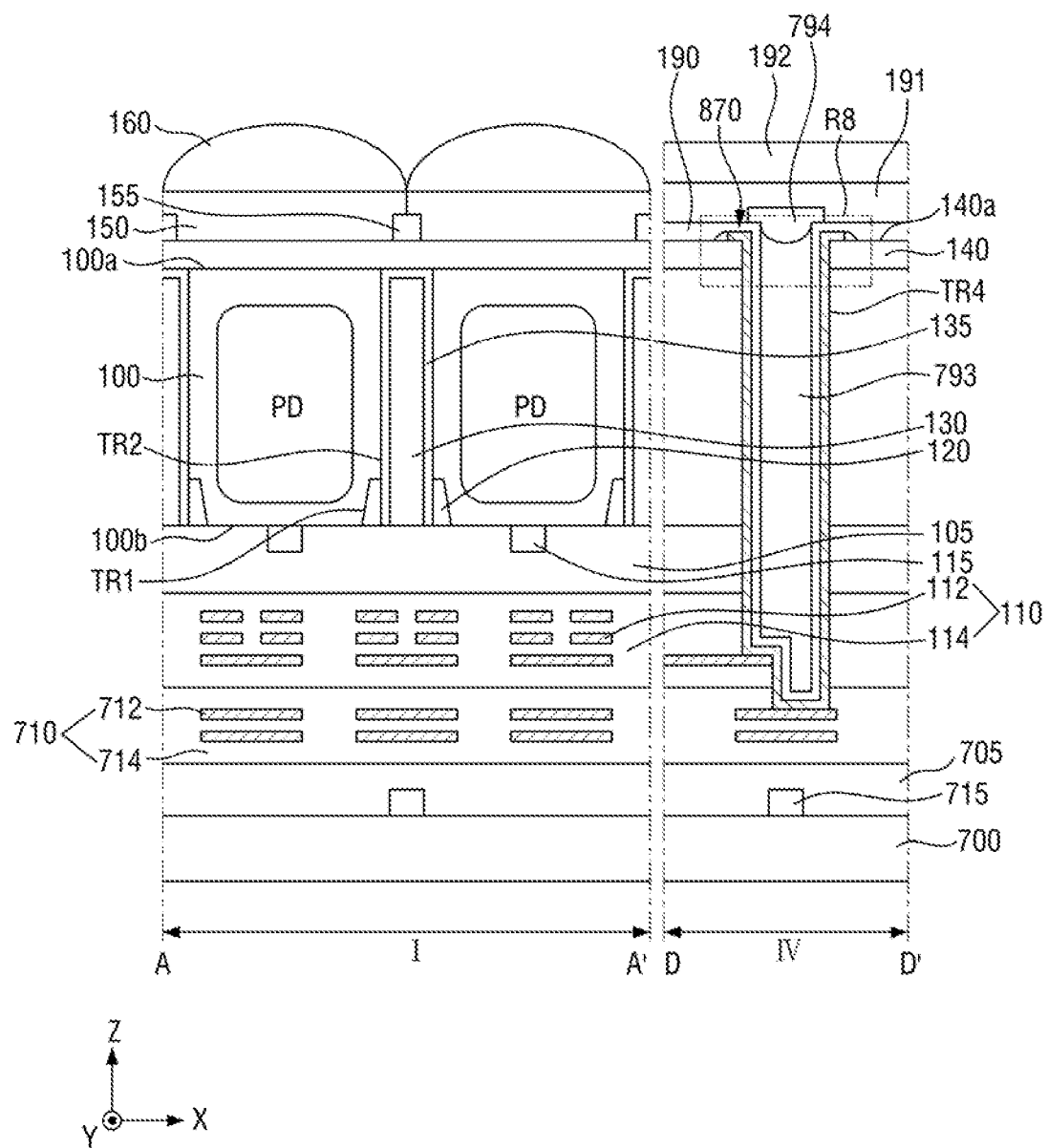
FIG. 19 is a cross-sectional view of an image sensor according to an exemplary embodiment of the present inventive concepts.
Figure 20:
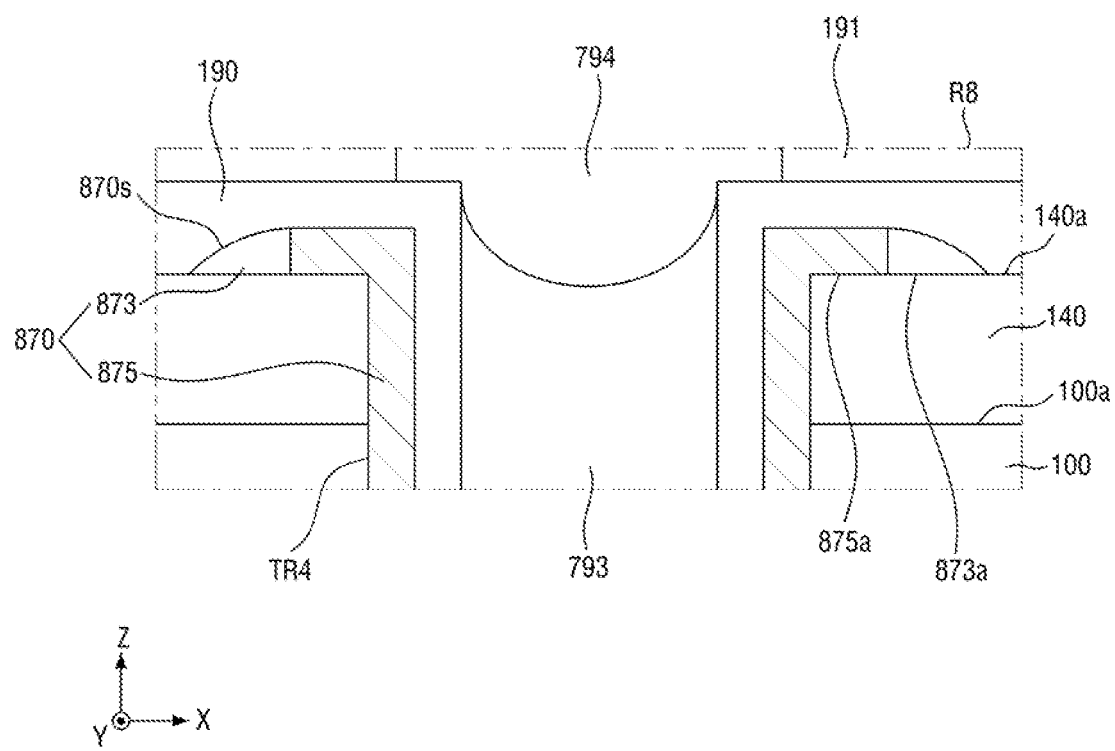
FIG. 20 is an enlarged view of region R8 of FIG. 19 according to an exemplary embodiment of the present inventive concepts.

FIG. 19 is a cross-sectional view for explaining an image sensor according to another exemplary embodiment the present inventive concepts. FIG. 20 is an enlarged view in which a region R8 of FIG. 19 is enlarged according to an exemplary embodiment of the present inventive concepts.

Referring to FIGS. 19 and 20, in an image sensor according to some other exemplary embodiments of the present inventive concepts, a pattern structure 870 disposed in the fourth region IV which is a connection region may include a metal film pattern 875 and a spacer pattern 873.

The pattern structure 870 may be disposed along the lateral side walls and bottom surface of the connection trench TR4. A portion of the pattern structure 870 may extend along the upper surface 140a of the passivation layer 140. For example, the lower surfaces of the pattern structure 870 disposed along the upper surface 140a of the passivation layer 140 may directly contact the upper surface 140a of the passivation layer 140.

A partial lateral side wall 870s of the pattern structure 870 disposed on the upper surface 140a of the passivation layer 140 may have a sloped profile. For example, as shown in the exemplary embodiment of FIG. 20, the partial lateral side wall 870s of the pattern structure 870 having a sloped profile may have a curved surface shape.

The metal film pattern 875 may be disposed along the lateral side walls and bottom surface of the connection trench TR4. A portion of the metal film pattern 875 may extend along the upper surface 140a of the passivation layer 140. For example, the lower surface 875a of the metal film pattern 875 disposed along the upper surface 140a of the passivation layer 140 may directly contact the upper surface 140a of the passivation layer 140.

The spacer pane 873 may be disposed on, one lateral side of the metal film pattern 875 disposed on the upper surface 140a of the passivation layer 140. The lateral side walls 870s of the spacer pattern 873 may have a sloped profile of a curved surface shape. The lower surface 873a of the spacer pattern 873 may be formed on the same plane as the lower surface 875a of the metal film pattern 875 which is in contact with the upper surface 140a of the passivation layer 140 and the lower surfaces 873a, 875a of the spacer pattern 873 and the metal film pattern 875 may be co-planar with each other e.g., in the Z direction).

A maximum thickness of the spacer pattern 873 (e.g., length in the Z direction) may be the same as a thickness of the metal film pattern 875 disposed on the upper surface 140a of the passivation layer 140 in the Z direction.

Although the exemplary embodiments according to the present inventive concepts have been described above with reference to the accompanying drawings, the present inventive concepts are not limited to the aforementioned exemplary embodiments and may be fabricated in various different forms. Those skilled in the art to which the present inventive concepts pertain will understand that the present inventive concepts may be implemented in other specific forms without changing the technical idea and essential features of the present inventive concepts. Therefore, it should be understood that the exemplary embodiments described above are illustrative in all aspects and are not restrictive or limiting.

What is claimed is:

1. An image sensor comprising:
a first region and a second region surrounding the first region;
a substrate including a first surface and a second surface that is opposite to the first surface;
a photoelectric conversion element disposed on the substrate;
a passivation layer disposed on the first surface of the substrate;
a microlens disposed on the passivation layer in the first region, the microlens is not disposed on the passivation layer in the second region; and
a pattern structure disposed on an upper surface of the passivation layer in the second region, the pattern structure includes a metal and has at least one lateral side wall having a sloped profile that slopes towards the first region,
wherein a first lateral sidewall of the at least one lateral side wall of the pattern structure has a convex surface shape curving outwardly towards the first region, and
wherein an uppermost surface of the first lateral sidewall is disposed farther away from the first region than all other surfaces of the first lateral sidewall and a lowermost surface of the first lateral sidewall is disposed closest to the first region than all other surfaces of the first lateral sidewall.

2. The image sensor of claim 1, wherein the pattern structure includes a first layer, and a second layer disposed on the first layer.

3. The image sensor of claim 2, wherein the first layer includes titanium (Ti) and the second layer includes tungsten (W).

4. The image sensor of claim 1, wherein the photoelectric conversion element is disposed inside the substrate in each of the first and second regions.

5. The image sensor of claim 1, wherein the pattern structure comprises:
a metal film pattern including a metal, and
a spacer pattern disposed on at least one lateral side wall of the metal film pattern, the spacer pattern having a lateral side wall with a sloped profile.

6. The image sensor of claim 5, wherein a lower surface of the metal film pattern is in direct contact with the upper surface of the passivation layer and the lower surface of the metal film pattern is co-planar with a lower surface of the spacer pattern.

7. The image sensor of claim 5, wherein a first thickness of the metal film pattern disposed on the passivation layer in a vertical direction is the same as a second thickness of the spacer pattern in the vertical direction.

8. The image sensor of claim 7, wherein the first thickness is in a range of about 2000 Å to about 4000 Å.

9. An image sensor comprising:
a first region and a second region surrounding the first region;
a substrate including a first surface and a second surface that is opposite to the first surface;
a photoelectric conversion element disposed inside the substrate in each of the first and second regions;
a microlens disposed on the first surface of the substrate in the first region, the microlens is not disposed on the first surface of the substrate in the second region; and
a pattern structure disposed on the first surface of the substrate in the second region, the pattern structure including at least one lateral side wall having a sloped profile that slopes towards the first region,
wherein the pattern structure includes a first layer and a second layer disposed on the first layer, the first layer and the second layer including different metals from each other,
wherein a first lateral sidewall of the at least one lateral side wall of the pattern structure has a convex surface shape curving outwardly towards the first region, and
wherein an uppermost surface of the first lateral sidewall is disposed farther away from the first region than all other surfaces of the first lateral sidewall and a lowermost surface of the first lateral sidewall is disposed closest to the first region than all other surfaces of the first lateral sidewall.

10. The image sensor of claim 9, wherein the pattern structure further includes a spacer pattern disposed on at least one lateral side wall of each of the first and second layers, the spacer pattern having a lateral side wall with a sloped profile.

11. The image sensor of claim 10, wherein:
a lower surface of the first layer is co-planar with a lower surface of the spacer pattern; and
a first thickness of the pattern structure in a vertical direction is the same as a second thickness of the spacer pattern in the vertical direction.

12. The image sensor of claim 9, wherein the first layer includes titanium (Ti) and the second layer includes tungsten (W).

13. The image sensor of claim 9, further comprising:
a passivation layer disposed on the first surface of the substrate,
wherein the pattern structure is in direct contact with the passivation layer.

14. An image sensor comprising:
a first region and a second region surrounding the first region;
a substrate including a first surface and a second surface that is opposite to the first surface;
a photoelectric conversion element disposed inside the substrate in each of the first and second regions;
a passivation layer disposed on the first surface of the substrate;
a microlens disposed on the first surface of the substrate in the first region, the microlens is not disposed on the first surface of the substrate in the second region; and
a pattern structure disposed on the passivation layer in the second region, the pattern structure including a first layer and a second layer disposed on the first layer,
wherein at least one lateral side wall of each of the first layer and the second layer have a sloped profile that slopes towards the first region, and the first layer and the second layer include different metals from each other, wherein a first lateral sidewall of the at least one lateral side wall of the pattern structure has a convex surface shape curving outwardly towards the first region, and wherein an uppermost surface of the first lateral sidewall is disposed farther away from the first region than all other surfaces of the first lateral sidewall and a lowermost surface of the first lateral sidewall is disposed closest to the first region than all other surfaces of the first lateral sidewall.

15. The image sensor of claim 14, wherein a thickness of the pattern structure in a vertical direction is in a range of about 2000 Å to about 4000 Å.

* * * * *